US011728246B2

(12) United States Patent
Kim et al.

(10) Patent No.: US 11,728,246 B2
(45) Date of Patent: Aug. 15, 2023

(54) SEMICONDUCTOR DEVICE HAVING A STACK INCLUDING ELECTRODES VERTICALLY STACKED ON A SUBSTRATE AND ELECTRONIC SYSTEM INCLUDING THE SAME

(71) Applicant: SAMSUNG ELECTRONICS CO., LTD., Suwon-si (KR)

(72) Inventors: Sunggil Kim, Yongin-si (KR); Jinhyuk Kim, Hwaseong-si (KR); Jung-Hwan Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 17/331,951

(22) Filed: May 27, 2021

(65) Prior Publication Data
US 2022/0115294 A1 Apr. 14, 2022

(30) Foreign Application Priority Data
Oct. 12, 2020 (KR) .................. 10-2020-0131406

(51) Int. Cl.
H01L 29/78 (2006.01)
H01L 23/48 (2006.01)
(Continued)

(52) U.S. Cl.
CPC ........ *H01L 23/481* (2013.01); *H01L 25/0652* (2013.01); *H01L 29/7827* (2013.01);
(Continued)

(58) Field of Classification Search
CPC ......... H01L 27/11556; H01L 27/11582; H01L 27/11575; H01L 27/11573;
(Continued)

(56) References Cited

U.S. PATENT DOCUMENTS 8,658,499 B2  2/2014 Makala et al.
9,748,267 B2  8/2017 Zhang et al.
(Continued)

FOREIGN PATENT DOCUMENTS

KR  10-2017-0131945 A  12/2017
KR  10-2017-0139331 A  12/2017
(Continued)

*Primary Examiner* — Khiem D Nguyen
(74) *Attorney, Agent, or Firm* — Lee IP Law, P.C.

(57) ABSTRACT

A semiconductor device and an electronic system, the device including a substrate including a cell array region and a connection region; a stack including electrodes vertically stacked on the substrate; a source conductive pattern on the cell array region and between the substrate and the stack; a dummy insulating pattern on the connection region and between the substrate and the stack; a conductive support pattern between the stack and the source conductive pattern and between the stack and the dummy insulating pattern; a plurality of first vertical structures on the cell array region and penetrating the electrode structure, the conductive support pattern, and the source structure; and a plurality of second vertical structures on the connection region and penetrating the electrode structure, the conductive support pattern, and the dummy insulating pattern.

20 Claims, 28 Drawing Sheets

(51) Int. Cl.
*H01L 25/065* (2023.01)
*H10B 41/27* (2023.01)
*H10B 43/27* (2023.01)

(52) U.S. Cl.
CPC .............. *H10B 41/27* (2023.02); *H10B 43/27* (2023.02); *H01L 2225/06541* (2013.01)

(58) Field of Classification Search
CPC ......... H01L 27/11524; H01L 27/11529; H01L 27/11548; H01L 27/1157; H01L 29/7827; H01L 23/481; H01L 2225/06541; H01L 2225/06548; H10B 43/27; H10B 43/40; H10B 43/50; H10B 41/27; H10B 41/35; H10B 41/41; H10B 41/50
USPC ......................................... 257/314, 324, 328
See application file for complete search history.

(56) References Cited

U.S. PATENT DOCUMENTS

| | | | |
|---|---|---|---|
| 10,026,747 B2* | 7/2018 | Hwang | ................... G11C 5/025 |
| 10,355,009 B1 | 7/2019 | Kai et al. | |
| 2012/0077320 A1* | 3/2012 | Shim | ................ H01L 27/11582 |
| | | | 438/269 |
| 2016/0163732 A1* | 6/2016 | Lim | ................... H01L 27/11573 |
| | | | 257/314 |
| 2017/0077026 A1* | 3/2017 | Okawa | ................ H01L 23/5226 |
| 2017/0148800 A1 | 5/2017 | Nishikawa et al. | |
| 2017/0200676 A1* | 7/2017 | Jeong | ................ H01L 27/11556 |
| 2017/0338241 A1 | 11/2017 | Lee | |
| 2017/0358356 A1 | 12/2017 | Lee | |
| 2019/0326315 A1* | 10/2019 | Lee | ................... H01L 27/11575 |
| 2020/0051997 A1 | 2/2020 | Park | |
| 2020/0160157 A1* | 5/2020 | Kim | ....................... G11C 16/08 |

FOREIGN PATENT DOCUMENTS

| | | |
|---|---|---|
| KR | 10-1944229 B1 | 1/2019 |
| KR | 10-2020-0018064 A | 2/2020 |
| KR | 10-2020-0038323 A | 4/2020 |

* cited by examiner

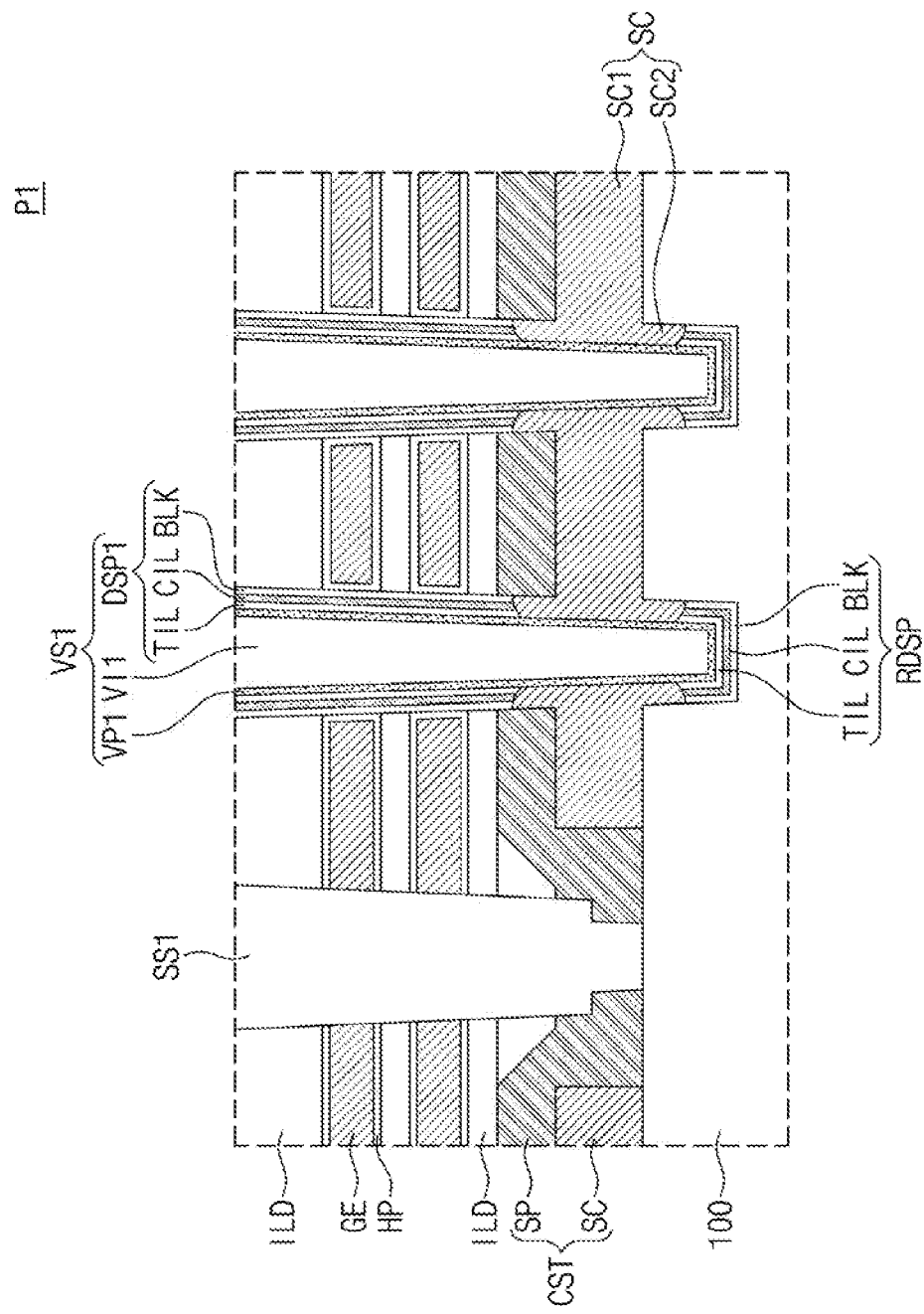

SEMICONDUCTOR DEVICE HAVING A STACK INCLUDING ELECTRODES VERTICALLY STACKED ON A SUBSTRATE AND ELECTRONIC SYSTEM INCLUDING THE SAME

CROSS-REFERENCE TO RELATED APPLICATIONS

Korean Patent Application No. 10-2020-0131406, filed on Oct. 12, 2020 in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

A semiconductor device capable of storing a large amount of data may be used as a part of an electronic system.

SUMMARY

The embodiments may be realized by providing a semiconductor device including a substrate including a cell array region and a connection region; a stack including electrodes vertically stacked on the substrate; a source conductive pattern on the cell array region and between the substrate and the stack; a dummy insulating pattern on the connection region and between the substrate and the stack; a conductive support pattern between the stack and the source conductive pattern and between the stack and the dummy insulating pattern; a plurality of first vertical structures on the cell array region and penetrating the stack, the conductive support pattern, and the source conductive pattern; and a plurality of second vertical structures on the connection region and penetrating the stack, the conductive support pattern, and the dummy insulating pattern.

The embodiments may be realized by providing a semiconductor device including a semiconductor substrate; a peripheral circuit structure including peripheral circuits integrated on the semiconductor substrate; a semiconductor layer on the peripheral circuit structure, the semiconductor layer including a cell array region and a connection region; a stack including electrodes vertically stacked on the semiconductor layer to form a stepwise structure on the connection region; a planarization insulating layer covering the stack; a source conductive pattern on the cell array region and between the substrate and the stack; a dummy insulating pattern on the connection region and between the substrate and the stack; a conductive support pattern between the stack and the source conductive pattern and between the stack and the dummy insulating pattern; a plurality of first vertical structures on the cell array region and penetrating the stack, the conductive support pattern, and the source conductive pattern, each of the first vertical structures including a first vertical semiconductor pattern, whose side surface is partially in contact with the source conductive pattern, and a first data storage pattern on the source conductive pattern and enclosing a part of the side surface of the first vertical semiconductor pattern; a plurality of second vertical structures on the connection region and penetrating the stack, the conductive support pattern, and the dummy insulating pattern, each of the second vertical structures including a second vertical semiconductor pattern spaced apart from the dummy insulating pattern, and a second data storage pattern conformally covering side and bottom surfaces of the second vertical semiconductor pattern; a first separation structure on the cell array region, extending in a first direction, and penetrating the stack, the conductive support pattern, and the source conductive pattern; and a second separation structure on the connection region, in contact with a top surface of the conductive support pattern, extending in the first direction, and penetrating the stack.

The embodiments may be realized by providing an electronic system including a semiconductor device including a substrate including a cell array region and a connection region, a stack including electrodes vertically stacked on the substrate, a source conductive pattern on the cell array region and between the substrate and the stack, a dummy insulating pattern on the connection region and between the substrate and the stack, a conductive support pattern between the stack and the source conductive pattern and between the stack and the dummy insulating pattern, a plurality of first vertical structures on the cell array region and penetrating the stack, the conductive support pattern, and the source conductive pattern, a plurality of second vertical structures on the connection region and penetrating the stack, the conductive support pattern, and the dummy insulating pattern, and an input/output pad electrically connected to peripheral circuits; and a controller electrically connected to the semiconductor device through the input/output pad and being configured to control the semiconductor device.

BRIEF DESCRIPTION OF THE DRAWINGS

Features will be apparent to those of skill in the art by describing in detail exemplary embodiments with reference to the attached drawings in which:

FIG. 7A is an enlarged sectional view of a portion P1 of FIG. 6A.

FIGS. 10A to 17A are sectional views, which are taken along the lines A-A' and B-B' of FIG. 5 of stages in a method of fabricating a semiconductor device according to an embodiment.

FIGS. 10B to 17B are sectional views, which are taken along the line C-C' of FIG. 5 of stages in a method of fabricating a semiconductor device according to an embodiment.

DETAILED DESCRIPTION

Figure 1:
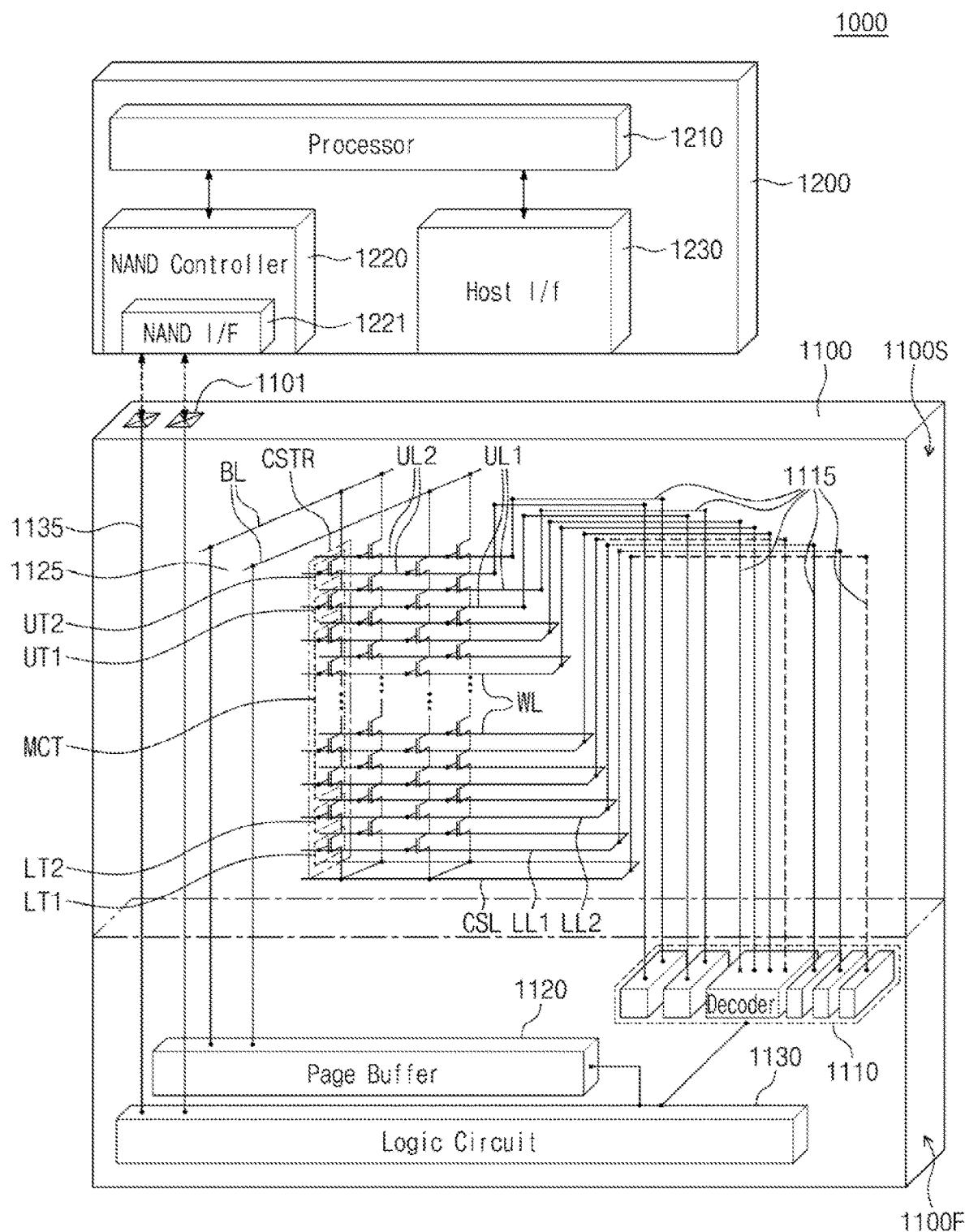
FIG. 1 is a diagram of an electronic system including a semiconductor device according to an embodiment.

FIG. 1 is a diagram of an electronic system including a semiconductor device according to an embodiment.

Referring to FIG. 1, an electronic system 1000 according to an embodiment may include a semiconductor device 1100 and a controller 1200, which are electrically connected to each other. The electronic system 1000 may be a storage device including one or more semiconductor devices 1100 or an electronic device including the storage device. In an implementation, the electronic system 1000 may be a solid state drive (SSD) device, a universal serial bus (USB) device, a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an implementation, the first structure 1100F may be beside the second structure 1100S. The first structure 1100F may be a peripheral circuit structure, which includes a decoder circuit 1110, a page buffer 1120, and a logic circuit 1130. The second structure 1100S may include a memory cell structure, which includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an implementation, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an implementation, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT1 may be used to perform an erase operation, in which a gate-induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F into the second structure 1100S.

In the first structure 1100F, the decoder circuit 1110 and the page buffer 1120 may be configured to control a control operation, which is performed on at least one of the memory cell transistors MCT by a selection memory cell transistor. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is in the first structure 1100F and is extended into the second structure 1100S.

The controller 1200 may include a processor 1210, a NAND controller 1220, and a host interface 1230. In an implementation, the electronic system 1000 may include a plurality of semiconductor devices 1100, and in this case, the controller 1200 may control the semiconductor devices 1100.

The processor 1210 may control overall operations the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands to control the semiconductor device 1100, data to be written in or read from the memory cell transistors MCT of the semiconductor device 1100, and so forth. The host interface 1230 may be configured to allow for communication between the electronic system 1000 and an external host. When a control command is received from an external host through the host interface 1230, the processor 1210 may be control the semiconductor device 1100 in response to the control command.

Figure 2:
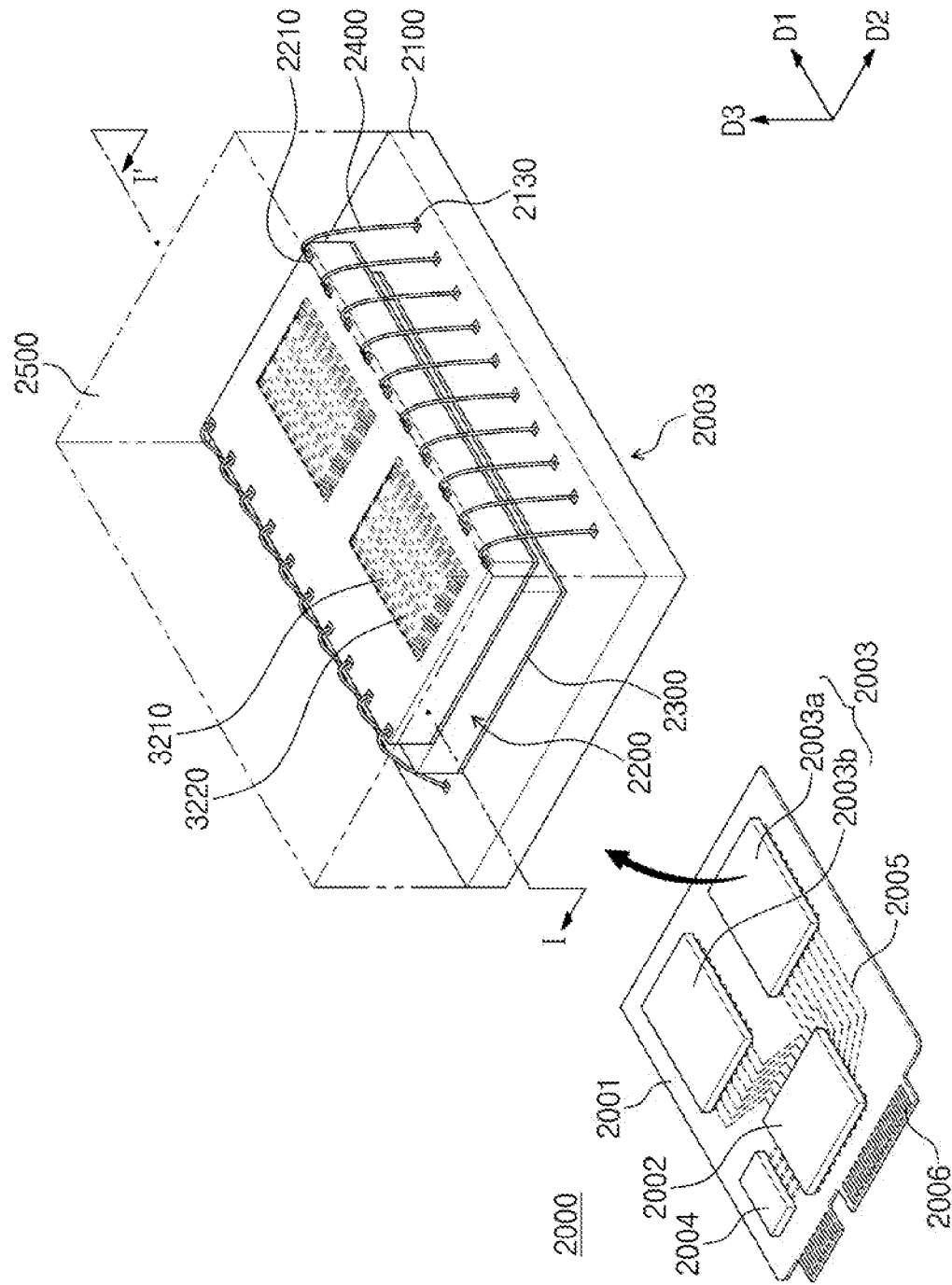
FIG. 2 is a perspective view of an electronic system including a semiconductor device according to an embodiment.

FIG. 2 is a perspective view of an electronic system including a semiconductor device according to an embodiment.

Referring to FIG. 2, an electronic system 2000 according to an embodiment may include a main substrate 2001 and a controller 2002, at least one semiconductor package 2003, and a dynamic random-access memory (DRAM) 2004, which are mounted on the main substrate 2001. The semiconductor package 2003 and the DRAM 2004 may be connected to the controller 2002 and to each other by interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an implementation, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an implementation, the electronic system 2000 may be driven by a power, which is supplied from the external host through the connector 2006. The electronic system 2000 may further include a Power Management Integrated Circuit (PMIC) distributing a power, which is supplied from the external host, to the controller 2002 and the semiconductor package 2003.

The controller 2002 may be configured to control a writing or reading operation on the semiconductor package 2003 and to help improve an operation speed of the electronic system 2000.

The DRAM 2004 may be a buffer memory, which relieves technical difficulties caused by a difference in speed between the semiconductor package 2003, which serves as a data storage device, and an external host. In an implementation, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 on respective bottom surfaces of the semiconductor chips 2200, a connection structure 2400 electrically connecting the semiconductor chips 2200 to the package substrate 2100, and a molding layer 2500 on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an embodiment.

In an implementation, the connection structure 2400 may be a bonding wire electrically connecting the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In an implementation, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an implementation, the controller 2002 and the semiconductor chips 2200 may be included in a single package. In an implementation, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
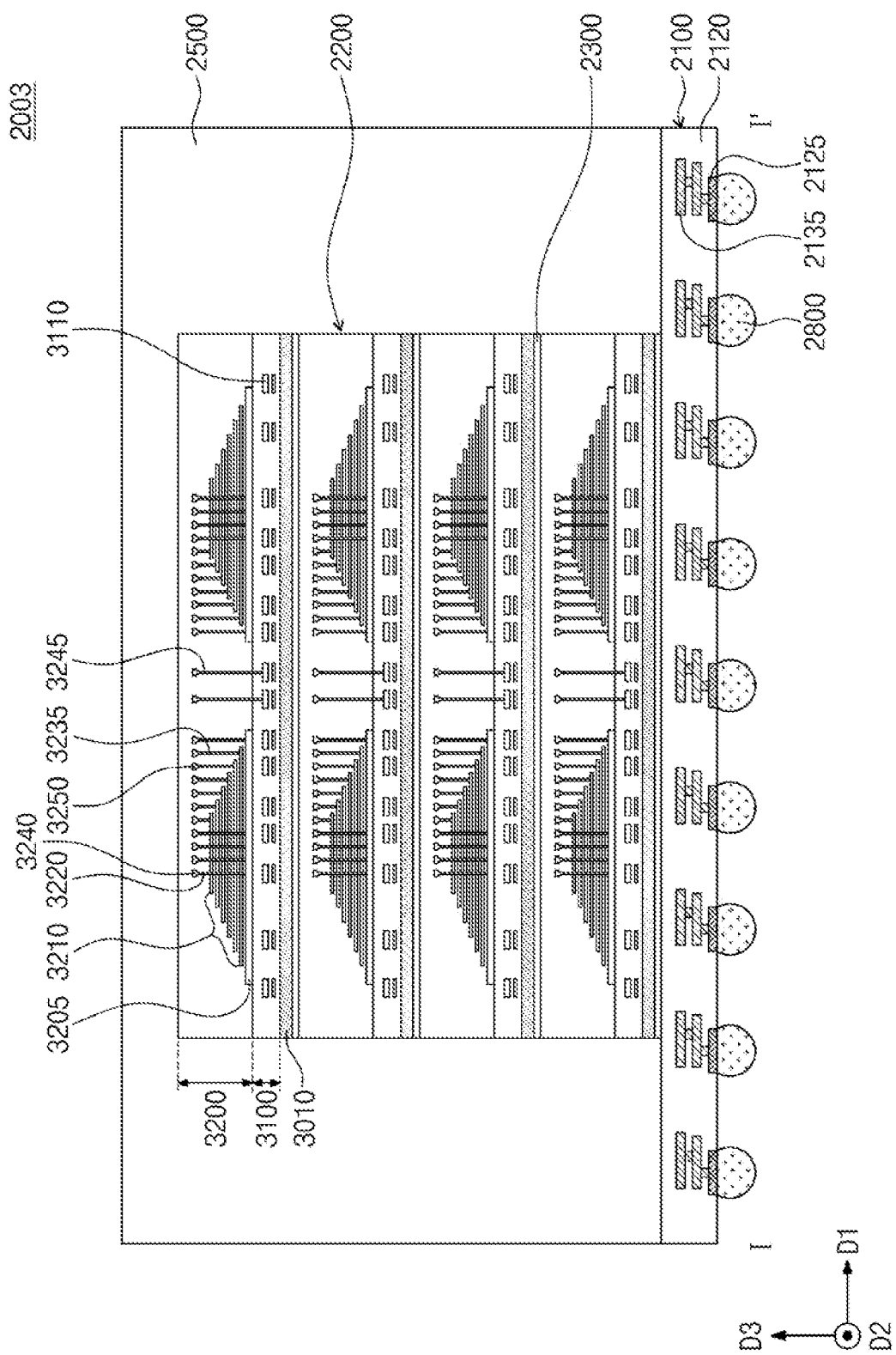
FIGS. 3 and 4 are sectional views of semiconductor packages according to an embodiment.
Figure 4:
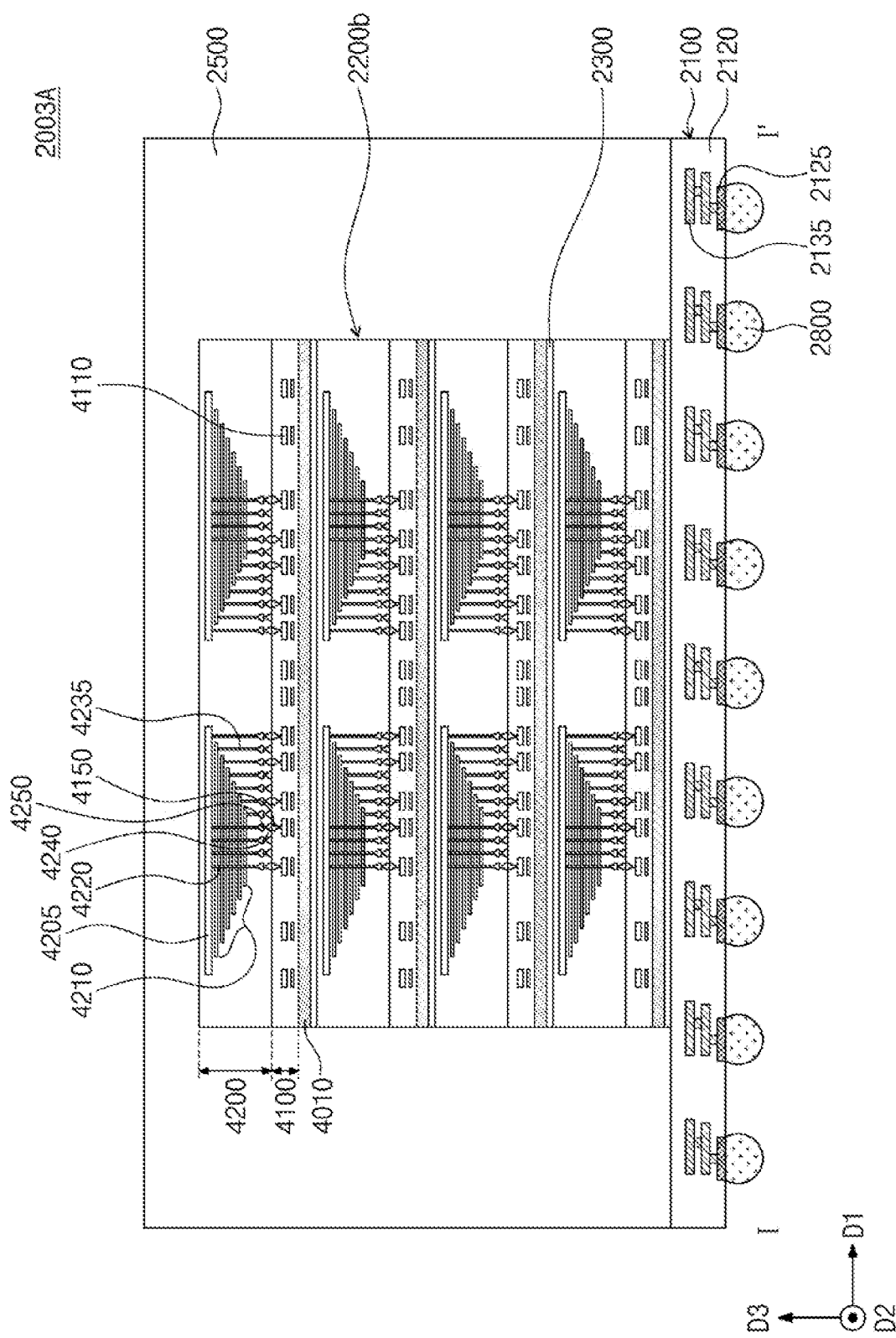

FIGS. 3 and 4 are sectional views of semiconductor packages according to an embodiment. FIGS. 3 and 4 are sectional views, which are taken along a line I-I' of FIG. 2, and illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2) on a top surface of the package substrate body portion 2120, lower pads 2125 on or exposed through a bottom surface of the package substrate body portion 2120, and internal lines 2135 in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 in the main substrate 2001 of the electronic system 2000, through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 and separation structures 3230 penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended (e.g., lengthwise) into the second structure 3200. The penetration line 3245 may be outside the stack 3210. In an implementation, the penetration line 3245 may further penetrate the stack 3210. Each of the semiconductor chips 2200 may further include the input/output pad 2210 (e.g., see FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200 on the first structure 4100 and bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 and a separation structure 4230 penetrating the stack 4210, and second junction structures 4250, which are respectively and electrically connected to the vertical structures 4220 and the word lines WL (e.g., of FIG. 1) of the stack 4210. In an implementation, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and coupled to the second junction structures 4250 of the second structure 4200. The coupled portions of the first junction structures 4150 and the second junction structures 4250 may be formed of or include, e.g., copper (Cu).

Each of the first and second structures 4100 and 4200 and the semiconductor chips 2200*a* may further include a source structure, as will be described below with reference to an embodiment. Each of the semiconductor chips 2200*a* may further include the input/output pads 2210 (e.g., of FIG. 2), which are electrically connected to the peripheral lines 4110 of the first structure 4100.

The semiconductor chips 2200 or 2200*a* of FIG. 3 or 4 may be electrically connected to each other by the connection structures 2400, which are provided in the form of bonding wires. In an implementation, semiconductor chips, which are provided in the same semiconductor package as the semiconductor chips 2200 or 2200*a* of FIG. 3 or 4, may be electrically connected to each other by a connection structure including through silicon vias (TSVs).

The first structure 3100 or 4100 of FIG. 3 or 4 may correspond to a peripheral circuit structure in an embodiment to be described below, and the second and second structure 3200 or 4200 of FIG. 3 or 4 may correspond to a cell array structure in an embodiment to be described below.

Figure 5:
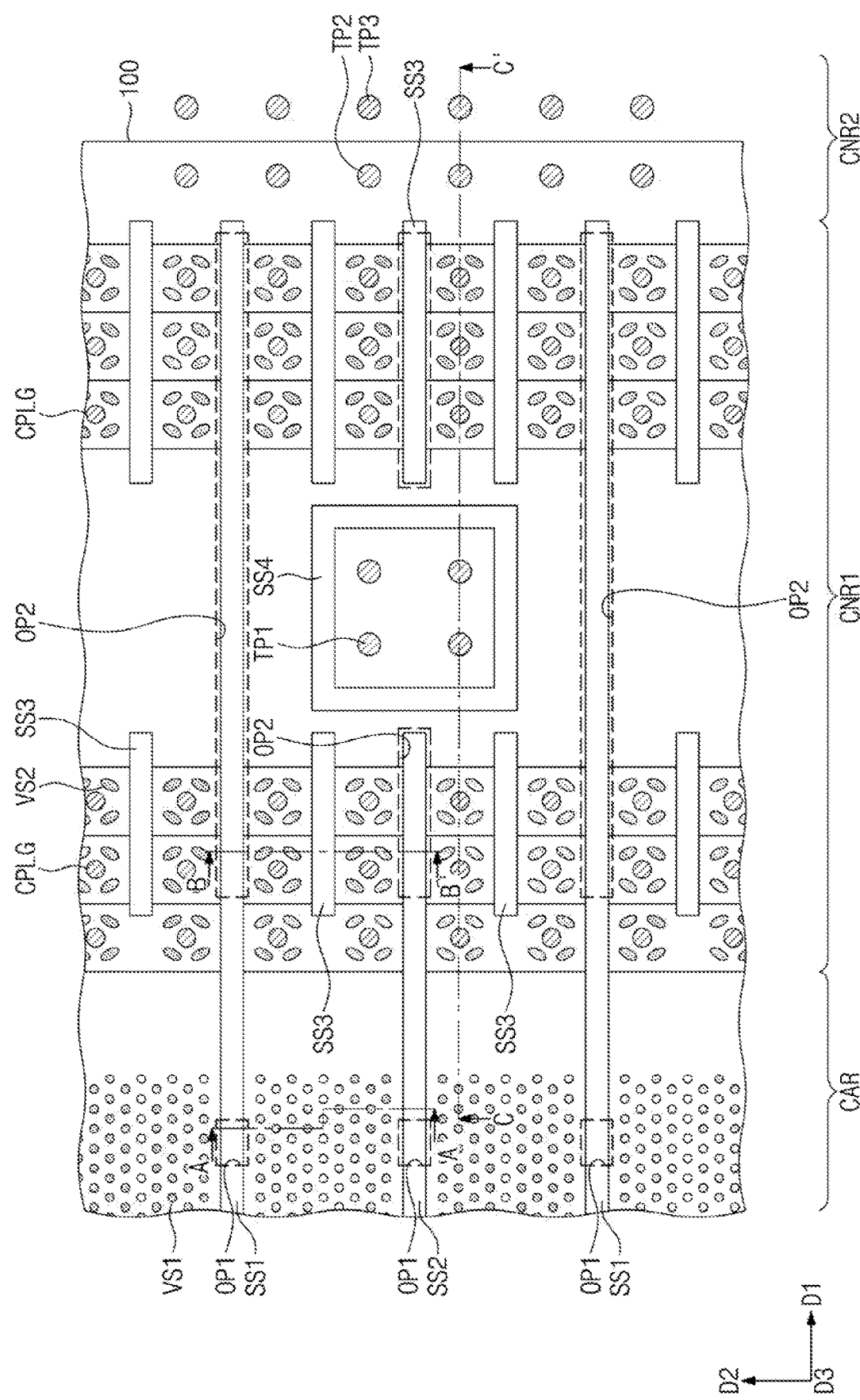
FIG. 5 is a plan view of a semiconductor device according to an embodiment.

FIG. 5 is a plan view of a semiconductor device according to an embodiment.

Figure 6A:
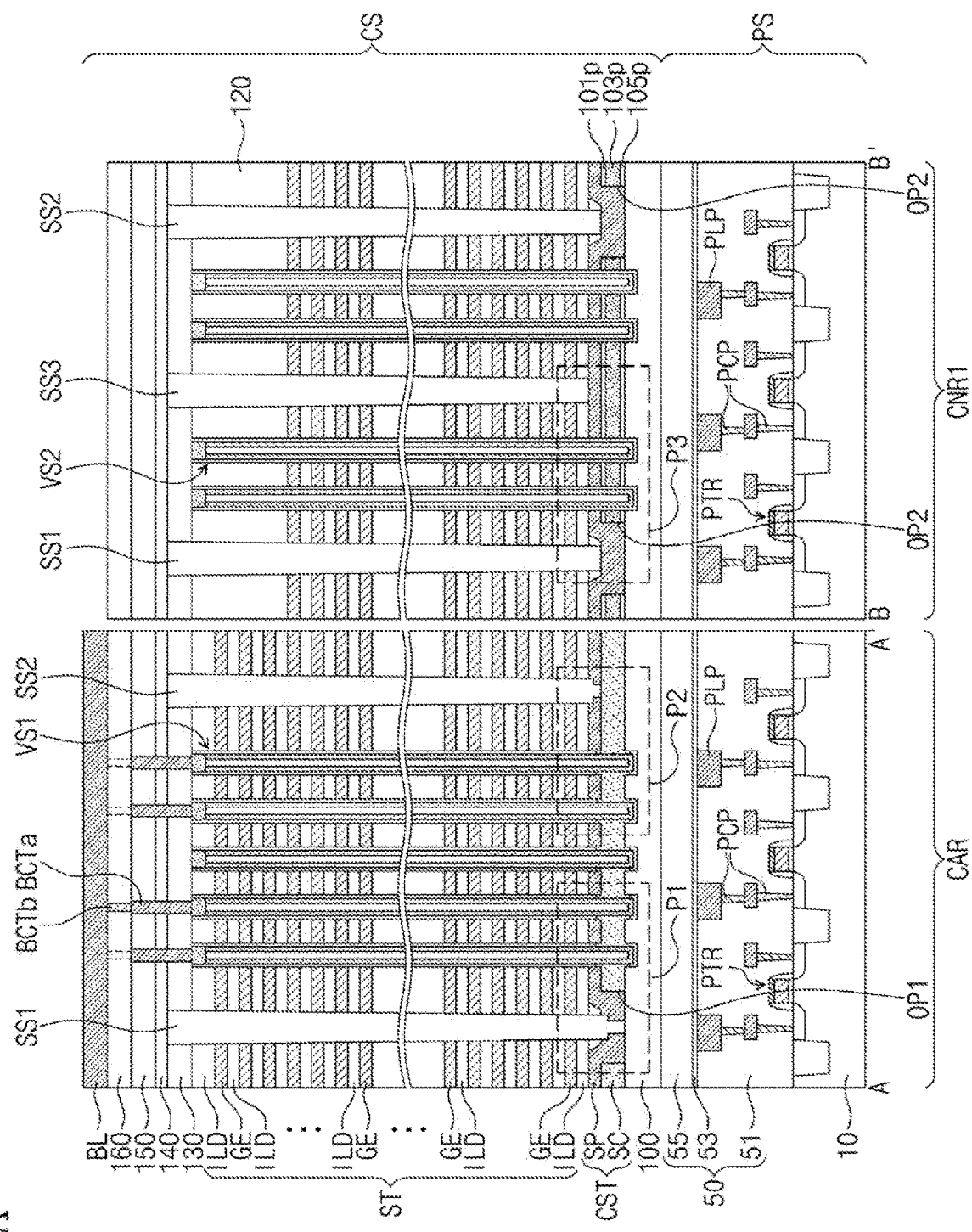
FIG. 6A is a sectional view, which is taken along lines A-A' and B-B' of FIG. 5 of a semiconductor device according to an embodiment.
Figure 6B:
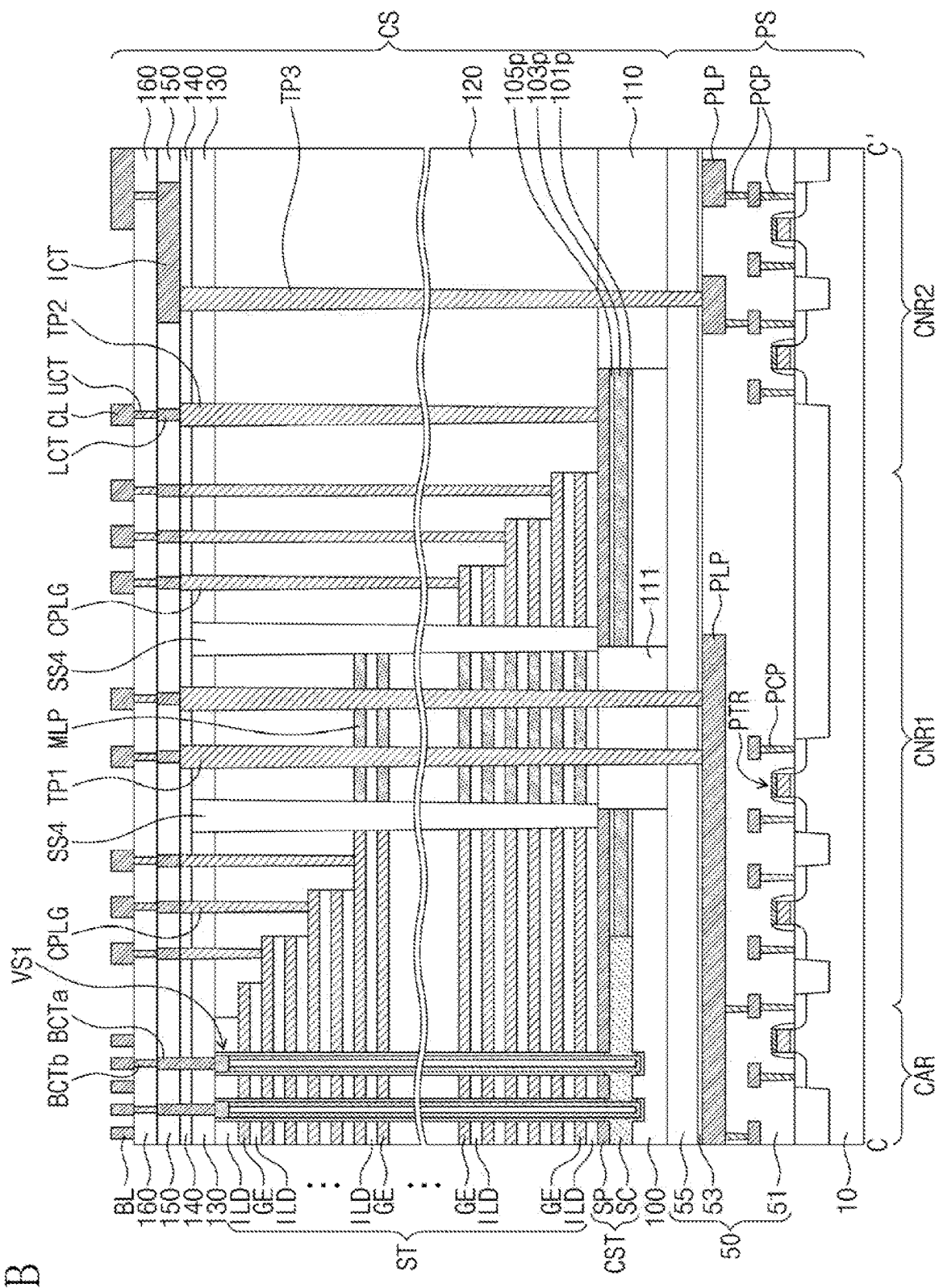
FIG. 6B is a sectional view, which is taken along a line C-C' of FIG. 5 of a semiconductor device according to an embodiment.

FIGS. 6A and 6B are sectional views of a semiconductor device according to an embodiment. FIG. 6A is a sectional view taken along lines A-A' and B-B' of FIG. 5, and FIG. 6C is a sectional view taken along a line C-C' of FIG. 5.

Figure 7B:
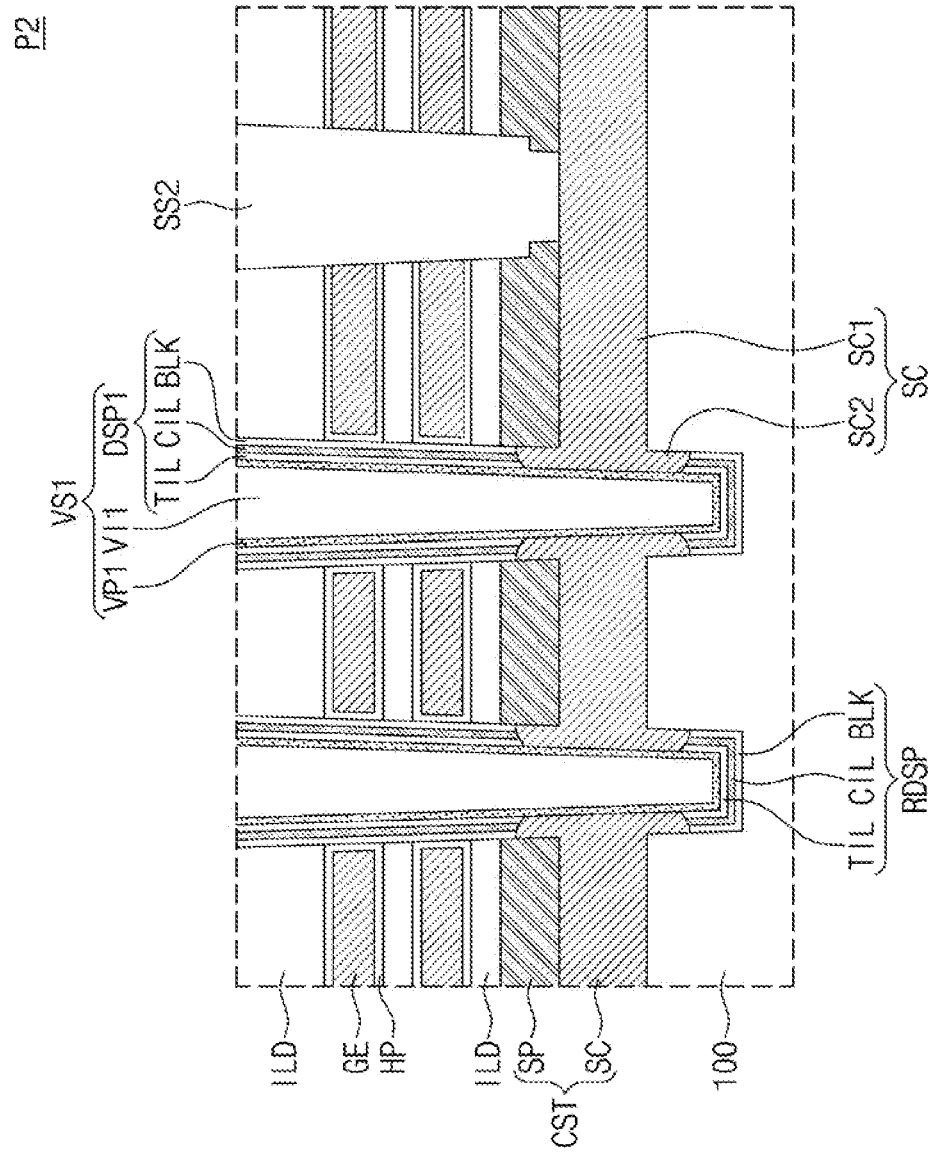
FIG. 7B is an enlarged sectional view of a portion P2 of FIG. 6A.
Figure 8:
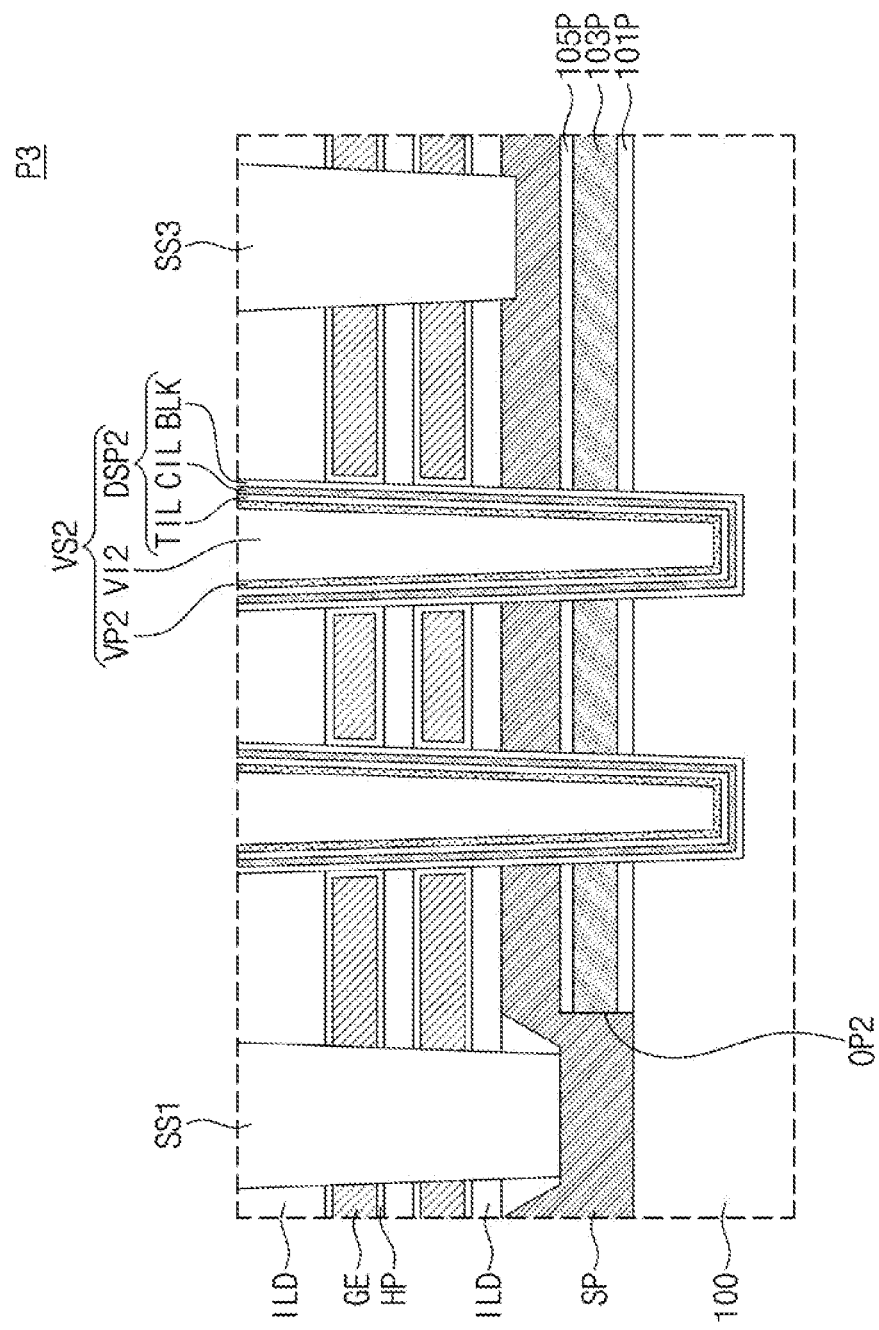
FIG. 8 is an enlarged sectional view of a portion P3 of FIG. 6A.

FIG. 7A is an enlarged sectional view of a portion P1 of FIG. 6A, and FIG. 7B is an enlarged sectional view of a portion P2 of FIG. 6A. FIG. 8 is an enlarged sectional view of a portion P3 of FIG. 6A.

Referring to FIGS. 5, 6A, and 6B, a semiconductor device according to an embodiment may include a peripheral circuit structure PS and a cell array structure CS on the peripheral circuit structure PS.

The peripheral circuit structure PS may include peripheral circuits PTR, which are integrated on a top surface of a semiconductor substrate 10, and a lower insulating layer 50, which may cover the peripheral circuits PTR.

The semiconductor substrate 10 may include a cell array region CAR and first and second connection regions CNR1 and CNR2. The first connection region CNR1 may be between the cell array region CAR and the second connection region CNR2, in a first direction D1. The semiconductor substrate 10 may be a silicon substrate.

The peripheral circuits PTR may include row and column decoders, a page buffer, a control circuit, or the like. In an implementation, the peripheral circuits PTR may include NMOS and PMOS transistors. Peripheral circuit interconnection lines may be electrically connected to the peripheral circuits PTR through peripheral contact plugs PCP.

The lower insulating layer 50 may be on the top surface of the semiconductor substrate 10. The lower insulating layer 50 may be on the semiconductor substrate 10 and may cover the peripheral circuits PTR, the peripheral contact plugs PCP, and peripheral circuit interconnection lines PLP. The peripheral contact plugs PCP and the peripheral circuit interconnection lines PLP may be electrically connected to the peripheral circuits PTR.

The lower insulating layer 50 may include a plurality of vertically-stacked insulating layers. In an implementation, the lower insulating layer 50 may include a silicon oxide layer, a silicon nitride layer, a silicon oxynitride layer, or a low-k dielectric layer. In an implementation, the lower insulating layer 50 may include a first lower insulating layer 51, a second lower insulating layer 55, and an etch stop layer 53 between the first and second lower insulating layers 51 and 55. The etch stop layer 53 may be formed of or include an insulating material that is different from the first and second lower insulating layers 51 and 55 and may cover top surfaces of the topmost ones of the peripheral circuit interconnection lines PLP. As used herein, the term "or" is not an exclusive term, e.g., "A or B" would include A, B, or A and B.

The cell array structure CS may be on the lower insulating layer 50. The cell array structure CS may include a semiconductor layer 100, a source structure CST, dummy insulating patterns 101*p*, 103*p*, and 105*p*, a stack ST, first and second vertical structures VS1 and VS2, cell contact plugs CPLG, penetration plugs TP1, TP2, and TP3, bit lines BL, and conductive lines CL. In an implementation, the cell strings CSTR shown in FIG. 1 may be integrated on the semiconductor layer 100. The stack ST and the first vertical structures VS1 may constitute the cell strings CSTR of FIG. 1.

In an implementation, the semiconductor layer 100 may be on a top surface (e.g., surface facing away from the semiconductor substrate 10 in a third direction D3) of the lower insulating layer 50. The semiconductor layer 100 may be formed of a semiconductor material, am insulating material, or a conductive material. The semiconductor layer 100 may be formed of or include a doped semiconductor material of the first conductivity type (e.g., n-type) or an undoped or intrinsic semiconductor material. The semiconductor layer 100 may be formed to have single-crystalline, polycrystalline, or amorphous structures.

The source structure CST may include a source conductive pattern SC and a conductive support pattern SP on the source conductive pattern SC. The source structure CST may be parallel to a top surface of the semiconductor layer 100 and may extend from on the cell array region CAR in a direction parallel to the stack ST or in the first direction D1.

In the cell array region CAR, the source conductive pattern SC may be between the semiconductor layer 100 and the stack ST. In the cell array region CAR, the source conductive pattern SC may have first openings OP1. The first openings OP1 may be spaced apart from each other and may have a circular or bar shape. The source conductive pattern SC may be formed of a semiconductor material that is doped with dopants (e.g., phosphorus (P) or arsenic (As)) to have a first conductivity type. In an implementation, the source conductive pattern SC may be formed of a polysilicon layer that is doped with n-type dopants.

In an implementation, on the first connection region CNR1, the dummy insulating patterns 101*p*, 103*p*, and 105*p* may be between the semiconductor layer 100 and the stack ST. The dummy insulating patterns 101*p*, 103*p*, and 105*p* may be at substantially the same level as (e.g., distance from the semiconductor substrate 10 in the third direction D3 as) the source conductive pattern SC.

On the first connection region CNR1, the dummy insulating patterns 101*p*, 103*p*, and 105*p* may have second openings OP2. The second openings OP2 may be spaced apart from each other and may have a bar or line shape. In an implementation, the second openings OP2 may have a line shape extending (e.g., lengthwise) in the first direction D1, and a length thereof in the first direction D1 may vary depending on position.

The dummy insulating patterns 101p, 103p, and 105p may include first, second, and third dummy insulating patterns 101p, 103p, and 105p, which are sequentially stacked. The second dummy insulating pattern 103p may be formed of or include an insulating material that is different from the first and second dummy insulating patterns 101p and 105p. The second insulating pattern 103p may be thicker than the first and second insulating patterns 101p and 105p (e.g., in the third direction D3). Each of the first, second, and third dummy insulating patterns 101p, 103p, and 105p may be formed of or include silicon oxide, silicon nitride, silicon oxynitride, silicon carbide, or silicon germanium.

The conductive support pattern SP may cover a top surface of the source conductive pattern SC on the cell array region CAR and may cover top surfaces of the dummy insulating patterns 101p, 103p, and 105p on the first connection region CNR1. The conductive support pattern SP may be formed of or include a doped semiconductor material of the first conductivity type (e.g., n-type) or an undoped or intrinsic semiconductor material.

On the cell array region CAR, portions of the conductive support pattern SP may penetrate the source conductive pattern SC and may be in contact (e.g., direct contact) with the semiconductor layer 100. On the first connection region CNR1, portions of the conductive support pattern SP may penetrate the dummy insulating patterns 101p, 103p, and 105p and may be in contact (e.g., direct contact) with the semiconductor layer 100. In an implementation, the conductive support pattern SP may include a first portion filling the first openings OP1 of the source conductive pattern SC and a second portion filling the second openings OP2 of the dummy insulating patterns 101p, 103p, and 105p. The conductive support pattern SP may cover a side surface of the source conductive pattern SC in the first openings OP1 and may cover side surfaces of the dummy insulating patterns 101p, 103p, and 105p in the second openings OP2. The conductive support pattern SP may have downwardly recessed top surfaces in the first and second openings OP1 and OP2.

A buried insulating pattern 110 may cover a side surface of the semiconductor layer 100 and a side surface of the source structure CST, on the second connection region CNR2. The buried insulating pattern 110 may be in contact with the lower insulating layer 50 and may have a top surface that is substantially coplanar with a top surface of the source structure CST.

On the first connection region CNR1, an insulating penetration pattern 111 may penetrate the source structure CST and the semiconductor layer 100. The insulating penetration pattern 111 may be in contact (e.g., direct contact) with the lower insulating layer 50 and may have a top surface that is substantially coplanar with the top surface of the source structure CST.

The stack ST may be on the source structure CST. The stack ST may extend from the cell array region CAR to the first connection region CNR1 in the first direction D1 and may have a stepwise structure on the first connection region CNR1.

The stack ST may include electrodes GE and insulating layers ILD, which are alternately stacked in the third direction D3 (e.g., a vertical direction). In an implementation, the third direction D3 may be perpendicular to first and second directions D1 and D2 crossing each other. The electrodes GE may be formed of or include, e.g., doped semiconductors (e.g., doped silicon or the like), metals (e.g., tungsten, copper, aluminum, or the like), conductive metal nitrides (e.g., titanium nitride, tantalum nitride, or the like), or transition metals (e.g., titanium, tantalum, or the like). The insulating layers ILD may include a silicon oxide layer or a low-k dielectric layer. In an implementation, the semiconductor device may be a vertical-type NAND FLASH memory device, and in this case, the electrodes GE of the stack ST may be used as the gate lower lines LL1 and LL2, the word lines WL, and the gate upper lines UL1 and UL2 described with reference to FIG. 1.

Each of the electrodes GE may include a pad portion on the first connection region CNR1. In an implementation, among of the electrodes GE of the stack ST, the pad portions of even- or odd-numbered electrodes GE may be disposed along the first direction D1, and the cell contact plugs CPLG may be respectively coupled to the pad portions of the even-numbered electrodes GE. In an implementation, among the electrodes GE of the stack ST, the pad portions of the 4n-th electrodes GE may be disposed along the first direction D1, where n is a positive integer. The side surfaces of the (4n−1)-th, (4n−2)-th, and (4n−3)-th electrodes GE may be aligned to the side surface of the 4n-th electrode GE. The cell contact plugs CPLG may be coupled to the pad portions of the 4n-th electrodes GE. In an implementation, the pad portions of the electrodes GE may be at positions that are different from each other in both of horizontal and vertical directions.

Referring to FIGS. 7A and 7B, a horizontal insulating pattern HP may conformally cover side surfaces of each electrode GE, which are adjacent to the first and second vertical structures VS1 and VS2, and top and bottom surfaces of each electrode GE. The horizontal insulating pattern HP may be formed of or include a high-k dielectric material (e.g., aluminum oxide or hafnium oxide).

A planarization insulating layer 120 may cover the pad portions of the stack ST, which are provided to the stepwise structure. The planarization insulating layer 120 may have a substantially flat top surface. The planarization insulating layer 120 may include a single insulating layer or a plurality of stacked insulating layers. First to fourth interlayer insulating layers 130, 140, 150, and 160 may be sequentially formed on the planarization insulating layer 120.

In an implementation, the stack ST may include mold patterns MLP on the first connection region CNR1 and, respectively, between the insulating layers ILD and are located at the same level as the electrodes GE. The mold patterns MLP may be formed of or include an insulating material, which is different from the insulating layers ILD. The mold patterns MLP may be formed of or include, e.g., silicon nitride, silicon oxynitride, or silicon germanium. The mold patterns MLP may be closer to the cell array region CAR than the pad portions of the electrodes GE are to the cell array region CAR. In an implementation, the mold patterns MLP may overlap with the insulating penetration pattern 111, when viewed in a plan view.

On the cell array region CAR, the first vertical structures VS1 may penetrate the stack ST and a source structure SCT. The first vertical structures VS1 may be arranged in a specific direction or in a zigzag shape, when viewed in a plan view. Each of the first vertical structures VS1 may include a lower vertical structure penetrating a lower portion of the stack ST, and an upper vertical structure penetrating an upper portion of the stack ST.

Referring to FIGS. 7A and 7B, each of the first vertical structures VS1 may include a first vertical semiconductor pattern VP1 and a first data storage pattern DSP1, enclosing or surrounding a (e.g., outer) side surface of the first vertical semiconductor pattern VP1.

In an implementation, the first vertical semiconductor pattern VP1 may have a pipe or macaroni shape (e.g., hollow cylindrical or cup shape) with closed bottom. The first vertical semiconductor pattern VP1 may have a 'U'-shaped section and an inner space of the first vertical semiconductor pattern VP1 may be filled with a first gap-fill insulating pattern VI1. The first vertical semiconductor pattern VP1 may be formed of or include a semiconductor material (e.g., silicon (Si), germanium (Ge), or compounds thereof). The first vertical semiconductor pattern VP1, which is formed of or includes a semiconductor material, may be channel regions of the upper transistors UT1 and UT2, the memory cell transistors MCT, and the lower transistors LT1 and LT2 described with reference to FIG. 1. The first vertical semiconductor pattern VP1 may have a bottom surface that is at a level lower than a bottom surface of the source conductive pattern SC.

A portion of the side surface of the first vertical semiconductor pattern VP1 may be in contact (e.g., direct contact) with the source conductive pattern SC. In an implementation, the source conductive pattern SC may include a horizontal portion SC1 between the conductive support pattern SP and the semiconductor layer 100 and parallel to the stack ST, and a sidewall portion SC2 in contact with and enclosing or surrounding the portion of the side surface of the first vertical semiconductor pattern VP1. A top surface of the horizontal portion SC1 may be in contact (e.g., direct contact) with a bottom surface of the conductive support pattern SP, and a bottom surface of the horizontal portion SC1 may be in contact (e.g., direct contact) with the top surface of the semiconductor layer 100. The sidewall portion SC2 of the source conductive pattern SC may extend from the horizontal portion SC1 to have a vertically protruding shape and to be in contact (e.g., direct contact) with a portion of a side surface of the conductive support pattern SP. A thickness of the sidewall portion SC2 in the third direction D3 may be greater than a thickness of the horizontal portion SC1 in the third direction D3.

The first data storage pattern DSP1 may extend (e.g., lengthwise) in the third direction D3 to enclose or surround the side surface of the first vertical semiconductor patterns VP1. In an implementation, the first data storage pattern DSP1 may be a pipe- or macaroni-shaped pattern with open top and an open bottom. A bottom surface of the first data storage pattern DSP1 may be at a level between the top and bottom surfaces of the conductive support pattern SP. The first data storage pattern DSP1 may be composed of one or more layers. In an implementation, the first data storage pattern DSP1 may be a data storage layer of a NAND FLASH memory device and may include a tunnel insulating layer TIL, a charge storing layer CIL, and a blocking insulating layer BLK, which are sequentially stacked (e.g., outwardly) on the side surface of the first vertical semiconductor pattern VP1. In an implementation, the charge storing layer CIL may be a trap insulating layer, a floating gate electrode, or an insulating layer with conductive nanodots.

In an implementation, a dummy data storage pattern RDSP may be in the semiconductor layer 100 and vertically (e.g., in the third direction D3) spaced apart from the first data storage pattern DSP1. The dummy data storage pattern RDSP may have the same layer structure as the first data storage pattern DSP1.

Referring back to FIGS. 5, 6A, and 6B, the second vertical structures VS2 may penetrate the planarization insulating layer 120, the stack ST, the conductive support pattern SP, and the dummy insulating patterns 101p, 103p, and 105p, in the first connection region CNR1. The second vertical structures VS2 may pass through the pad portions of the electrodes GE.

Referring to FIG. 8, each of the second vertical structures VS2 may include a second vertical semiconductor pattern VP2 and a second data storage pattern DSP2 conformally covering side and bottom surfaces of the second vertical semiconductor pattern VP2.

The second vertical semiconductor pattern VP2 may have a 'U'-shaped section, and an inner space of the second vertical semiconductor pattern VP2 may be filled with a second gap-fill insulating pattern VI2. The second vertical semiconductor pattern VP2 may include the same semiconductor material as the first vertical semiconductor pattern VP1. The second vertical semiconductor pattern VP2 may be spaced apart from the semiconductor layer 100, the conductive support pattern SP, and the dummy insulating patterns 101p, 103p, and 105p by the second data storage pattern DSP2.

The second data storage pattern DSP2 may be formed of the same material as the first data storage pattern DSP1. In an implementation, the second data storage pattern DSP2 may include the tunnel insulating layer TIL, the charge storing layer CIL, and the blocking insulating layer BLK, which are sequentially (e.g., outwardly) stacked. The second data storage pattern DSP2 may include a portion between a side surface of the second vertical semiconductor pattern VP2 and the side surfaces of the dummy insulating patterns 101p, 103p, and 105p.

Referring back to FIGS. 5, 6A, and 6B, first, second, and third separation structures SS1, SS2, and SS3 may be on the semiconductor layer 100 and may penetrate the stack ST. Each of the first, second, and third separation structures SS1, SS2, and SS3 may include an insulating layer covering the side surface of the stack ST. Each of the first, second, and third separation structures SS1, SS2, and SS3 may have a single or multi-layered structure. Top surfaces of the first, second, and third separation structures SS1, SS2, and SS3 may be at substantially the same level.

Referring to FIGS. 6A and 7A, the first separation structures SS1 may extend from on the cell array region CAR onto the first connection region CNR1 in the first direction D1 and may be spaced apart from each other in the second direction D2 crossing the first direction D1. On the cell array region CAR, the first separation structures SS1 may penetrate the first portion of the conductive support pattern SP filling the first opening OP1. On the cell array region CAR, the first separation structures SS1 may be in contact (e.g., direct contact) with the semiconductor layer 100. Each of the first separation structures SS1 may include a lower portion penetrating the first portion of the conductive support pattern SP and an upper portion penetrating the stack ST. In an implementation, a width (e.g., in the first direction D1) of the lower portion may be smaller than a width of the upper portion. The lower portion of the first separation structures SS1 may include a bottom portion and a middle portion. The bottom portion may have a first width and may be in contact with the semiconductor layer 100. The middle portion may have a second width greater than the first width and smaller than a width of the upper portion.

On the first connection region CNR1, the first separation structures SS1 may be on the second portion of the conductive support pattern SP filling the second opening OP2. In an implementation, on the first connection region CNR1, the first separation structures SS1 may be in contact with the top surface of the conductive support pattern SP. The second portion of the conductive support pattern SP may have a substantially uniform thickness.

Referring to FIGS. 6A and 7B, the second separation structure SS2 may penetrate the stack ST, on the cell array region CAR. The second separation structure SS2 may be between the first separation structures SS1. When measured in the first direction D1, a length of the second separation structure SS2 may be smaller than a length of the first separation structure SS1. In an implementation, a plurality of the second separation structures SS2 may be between the first separation structures SS1. The second separation structure SS2 may be in contact with the top surface of the source conductive pattern SC, on the cell array region CAR, and may be in contact with the top surface of the conductive support pattern SP, on the first connection region CNR1. On the cell array region CAR, a thickness (e.g., in the third direction D3) of the conductive support pattern SP, which is left or remains under the second separation structure SS2, may be smaller than a thickness of the conductive support pattern SP between the stack ST and the source conductive pattern SC. On the first connection region CNR1, the conductive support pattern SP, which is left under the second separation structure SS2, may have a substantially uniform thickness.

Referring to FIGS. 6A and 8, the third separation structures SS3 may be on the first connection region CNR1 and may penetrate the planarization insulating layer 120 and the stack ST at a position spaced apart from the first and second separation structures SS1 and SS2. The third separation structures SS3 may extend in the first direction D1. The third separation structures SS3 may be spaced apart from each other in both of the first and second directions D1 and D2. The third separation structures SS3 may be in contact with the top surface of the conductive support pattern SP, on the first connection region CNR1. The conductive support pattern SP may have a substantially uniform thickness, between the third separation structures SS3 and the dummy insulating patterns 101p, 103p, and 105p.

Referring to FIGS. 5 and 6B, an insulating penetration pattern SS4 may penetrate a portion of the stack ST, on the first connection region CNR1. The insulating penetration pattern SS4 may be between the electrodes GE and the mold patterns MLP. The insulating penetration pattern SS4 may enclose or surround the mold patterns MLP, when viewed in a plan view. The insulating penetration pattern SS4 may include an insulating layer covering the side surface of the stack ST and the side surfaces of the mold patterns MLP. The insulating penetration pattern SS4 may be in contact with the top surface of the conductive support pattern SP or the top surface of the insulating penetration pattern 111. A top surface of the insulating penetration pattern SS4 may be at substantially the same level as the top surfaces of the first, second, and third separation structures SS1, SS2, and SS3.

Referring back to FIGS. 5, 6A, and 6B, the cell contact plugs CPLG may penetrate the first and second interlayer insulating layers 130 and 140 and the planarization insulating layer 120 and may be coupled to the pad portions of the electrodes GE, respectively. The smaller the distance to the cell array region CAR, the smaller the vertical lengths of the cell contact plugs CPLG (e.g., due to the staircase structure). The cell contact plugs CPLG may have top surfaces that are substantially coplanar with each other. The conductive lines CL may be on the fourth interlayer insulating layer 160 of the first connection region CNR1 and may be coupled to the cell contact plugs CPLG through lower and upper contact plugs LCT and UCT.

In an implementation, in the structure of FIG. 6A or 6B, the bit lines BL may be on the fourth interlayer insulating layer 160 on the cell array region CAR and may extend in the second direction D2 to cross the stack ST. The bit lines BL may be electrically connected to the first vertical structures VS1 through lower and upper bit line contact plugs BCTa and BCTb.

On the first connection region CNR1, first penetration plugs TP1 may vertically penetrate the mold patterns MLP of the stack ST and the insulating penetration pattern 111 and may be connected to the peripheral circuit interconnection line PLP. The first penetration plugs TP1 may be electrically connected to the cell contact plugs CPLG through the conductive lines CL.

On the second connection region CNR2, second penetration plugs TP2 may penetrate the planarization insulating layer 120 and may be coupled to the conductive support pattern SP. In an implementation, the second penetration plugs TP2 may penetrate the planarization insulating layer 120, the conductive support pattern SP, and the dummy insulating patterns 101p, 103p, and 105p and may be coupled to the semiconductor layer 100. The second penetration plugs TP2 may be horizontally spaced apart from the stack ST.

On the second connection region CNR2, third penetration plugs TP3 may penetrate the planarization insulating layer 120 and the buried insulating pattern 110 and may be coupled to the peripheral circuit interconnection line PLP. The third penetration plugs TP3 may be horizontally spaced apart from the stack ST.

The first, second, and third penetration plugs TP1, TP2, and TP3 may have substantially the same vertical length (e.g., height in the third direction D3) and may be formed of or include the same conductive material. Each of the first, second, and third penetration plugs TP1, TP2, and TP3 may include a barrier metal layer, which is formed of or includes a conductive metal nitride (e.g., titanium nitride, tantalum nitride, or the like), and a metal layer, which is formed of or includes a metal (e.g., tungsten, titanium, tantalum, or the like).

A connection conductive pattern ICT may be on the second interlayer insulating layer 140 and on the second connection region CNR2 and may be connected to the third penetration plug TP3.

Figure 9:
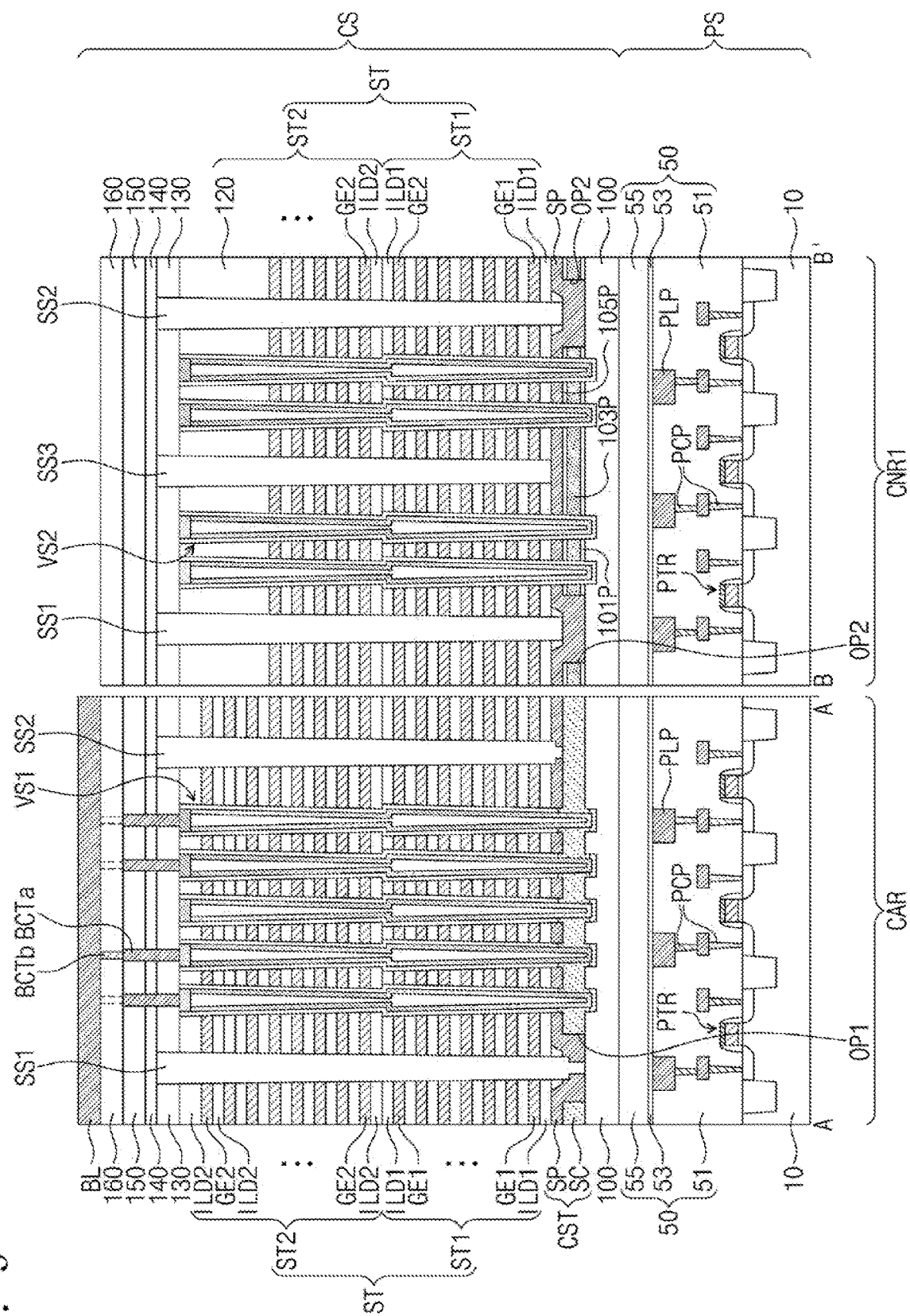
FIG. 9 is a sectional view, which is taken along the lines A-A' and B-B' of FIG. 5 of a semiconductor device according to an embodiment.

FIG. 9 is a sectional view, which is taken along the lines A-A' and B-B' of FIG. 5 to illustrate a semiconductor device according to an embodiment. For concise description, an element previously described with reference to FIGS. 5 to 8 may be identified by the same reference number without repeating an overlapping description thereof.

Referring to FIGS. 5 and 9, the stack ST on the semiconductor layer 100 may include a first electrode structure ST1 and a second electrode structure ST2 on the first electrode structure ST1. The first electrode structure ST1 may include first electrodes EL1, which are stacked on the semiconductor layer 100 in a vertical direction, e.g., the third direction D3. The first electrode structure ST1 may further include first insulating layers ILD1, which separate the stacked first electrodes EL1 from each other. In the first electrode structure ST1, the first insulating layers ILD1 and the first electrodes EL1 may be alternately stacked in the third direction D3. In an implementation, a second insulating layer ILD2 may be a topmost layer of the first electrode structure ST1.

The second electrode structure ST2 may include second electrodes EL2 stacked on the first electrode structure ST1 in the third direction D3. The second electrode structure ST2 may further include second insulating layers ILD2, which separate the stacked second electrodes EL2 from each other. In the second electrode structure ST2, the second insulating layers ILD2 and the second electrodes EL2 may be alternately stacked in the third direction D3.

Each of the first and second vertical structures VS1 and VS2 may include a first vertical extended portion penetrating the first electrode structure ST1, a second vertical extended portion penetrating the second electrode structure ST2, and an expanded portion between the first and second vertical extended portions. The expanded portion may be in the uppermost first insulating layer ILD1 of the first insulating layers ILD1. A diameter of the first and second vertical structure VS1 or VS2 may be rapidly increased or relatively greater at the expanded portion.

FIGS. 10A to 17A are sectional views, which are taken along the lines A-A' and B-B' of FIG. 5 of stages in a method of fabricating a semiconductor device according to an embodiment. FIGS. 10B to 17B are sectional views, which are taken along the line C-C' of FIG. 5 of stages in a method of fabricating a semiconductor device according to an embodiment.

Figure 10A:
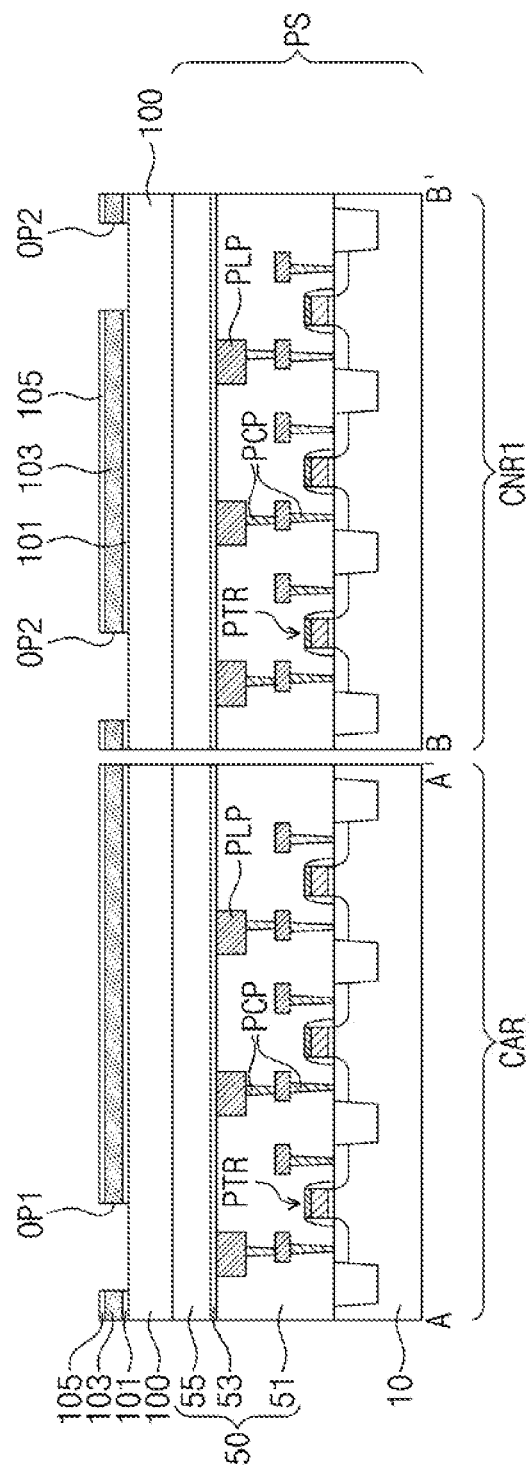
Figure 10B:
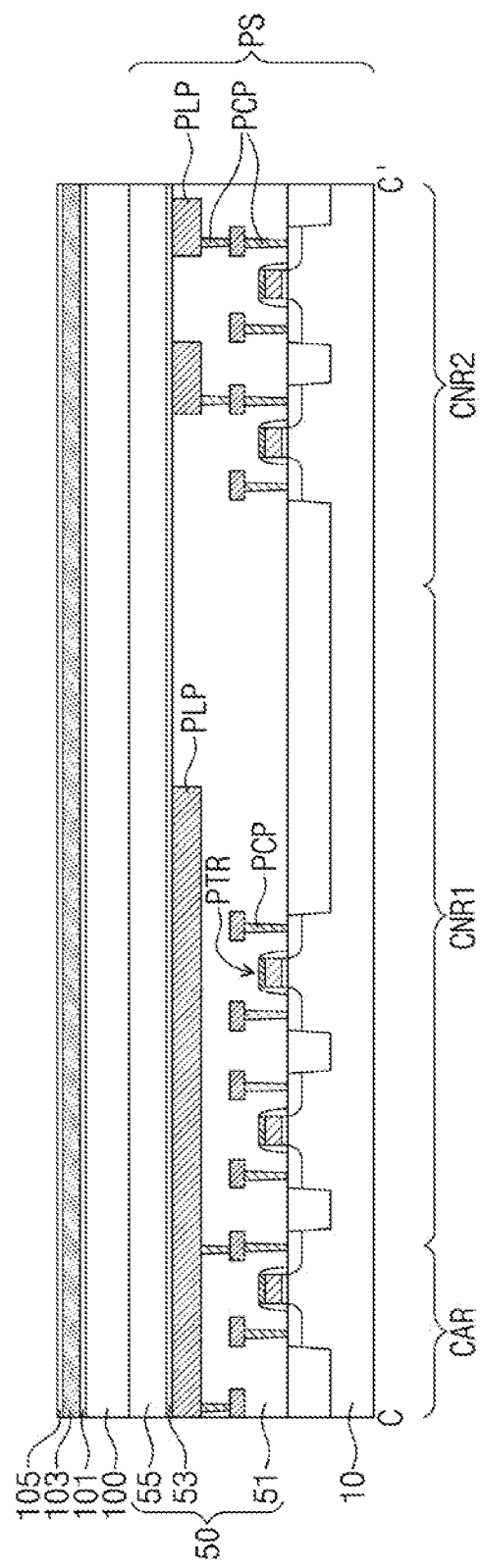

Referring to FIGS. 10A and 10B, the peripheral circuit structure PS may be formed on the semiconductor substrate 10.

The formation of the peripheral circuit structure PS may include forming the peripheral circuits PTR on the semiconductor substrate 10, forming peripheral interconnection structures PCP and PLP connected to the peripheral circuits PTR, and forming the lower insulating layer 50. In an implementation, the peripheral circuits PTR may include MOS transistors, and in this case, the semiconductor substrate 10 may be channel regions of the MOS transistors.

The lower insulating layer 50 may include one or more insulating layers covering the peripheral circuits PTR. The lower insulating layer 50 may include the first lower insulating layer 51, the second lower insulating layer 55, and the etch stop layer 53 between the first and second lower insulating layers 51 and 55. The lower insulating layer 50 may be formed of or include, e.g., silicon oxide, silicon nitride, silicon oxynitride, or low-k dielectric materials.

The formation of the peripheral interconnection structures PCP and PLP may include forming the peripheral contact plugs PCP to penetrate portions of the lower insulating layer 50 and forming the peripheral circuit interconnection lines PLP connected to the peripheral contact plugs PCP.

Next, the semiconductor layer 100 may be formed by depositing a semiconductor material on the lower insulating layer 50. The semiconductor layer 100 may be formed of or include a semiconductor material (e.g., silicon (Si), germanium (Ge), silicon germanium (SiGe), gallium arsenic (GaAs), indium gallium arsenic (InGaAs), aluminum gallium arsenic (AlGaAs), or compounds thereof). The semiconductor layer 100 may be formed of or include a doped semiconductor material or an undoped or intrinsic semiconductor material. The semiconductor layer 100 may have a polycrystalline, amorphous, or single-crystalline structure.

A first insulating layer 101, a second insulating layer 103, a third insulating layer 105 may be sequentially stacked on the semiconductor layer 100. The first insulating layer 101 may be formed by performing a thermal oxidation process on a surface of the semiconductor layer 100 or by depositing a silicon oxide layer. The second insulating layer 103 may be formed of or include a material having an etch selectivity with respect to the first insulating layer 101 and the third insulating layer 105. In an implementation, the second insulating layer 103 may be formed of or include silicon nitride, silicon oxynitride, silicon carbide, or silicon germanium. In an implementation, the third insulating layer 105 may be a silicon oxide layer that is formed by a deposition process.

The first, second, and third insulating layers 101, 103, and 105 may have the first and second openings OP1 and OP2, which are respectively formed on the cell array region CAR and the first connection region CNR1 to partially expose the semiconductor layer 100.

The formation of the first and second openings OP1 and OP2 may include forming a mask pattern to partially expose the first connection region CNR1 and the cell array region CAR and then etching the first, second, and third insulating layers 101, 103, and 105 using the mask pattern as an etch mask to expose the first insulating layer 101 or the semiconductor layer 100. The mask pattern may be removed after the formation of the first and second openings OP1 and OP2.

Figure 11A:
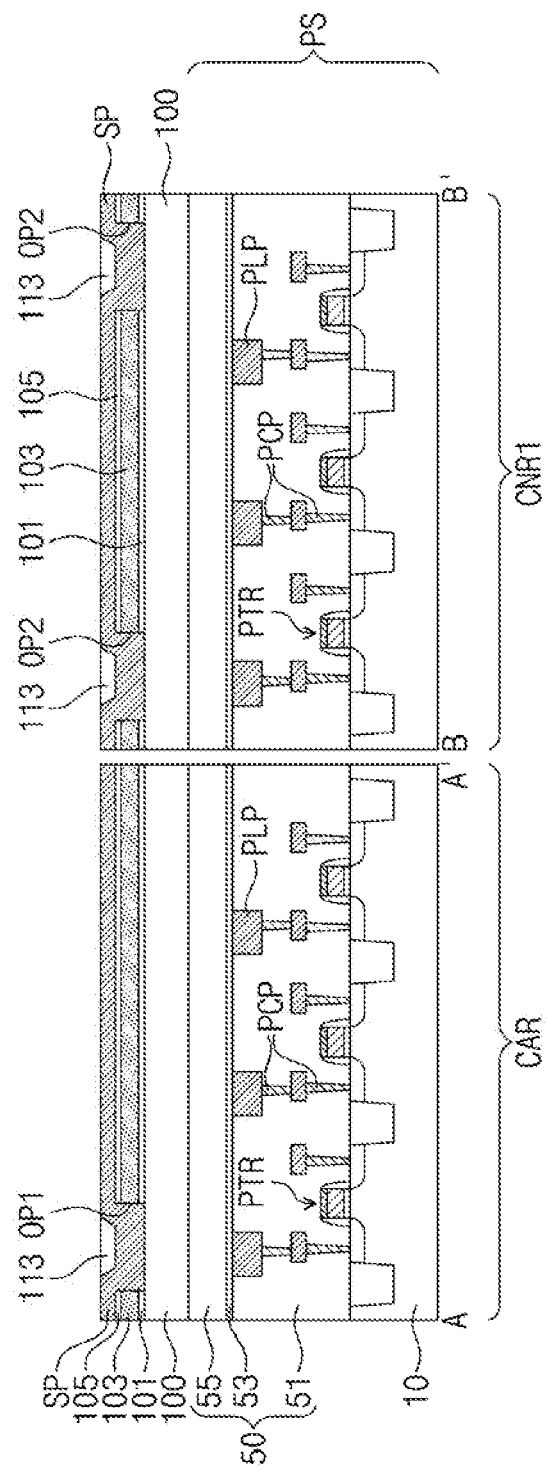
Figure 11B:
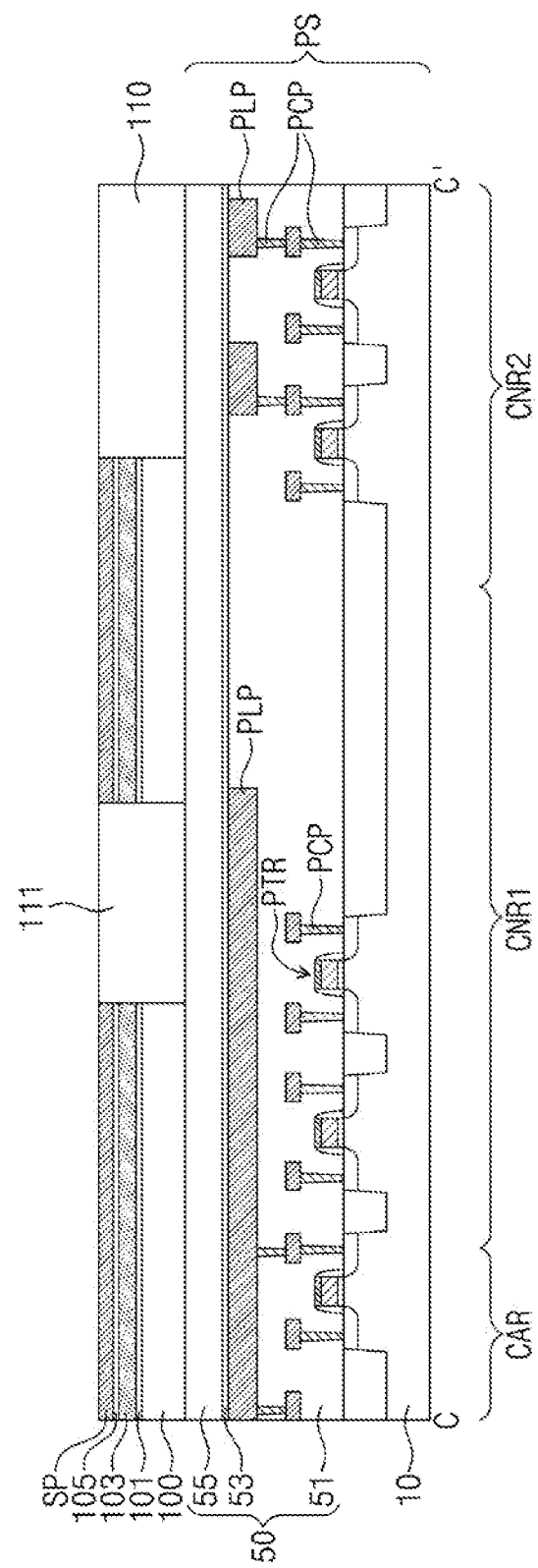

Referring to FIGS. 11A and 11B, a conductive support layer SP may be deposited on the third insulating layer 105 to have a uniform thickness, after the formation of the first and second openings OP1 and OP2. The conductive support layer SP may fill the first and second openings OP1 and OP2 of the first, second, and third insulating layers 101, 103, and 105 in the cell array region CAR. In the first and second openings OP1 and OP2, the conductive support layer SP may be in direct contact with the semiconductor layer 100. The conductive support layer SP may be a poly-silicon layer doped with n-type dopants and/or carbon (C) atoms.

Next, the conductive support layer SP, the third insulating layer 105, the second insulating layer 103, the first insulating layer 101, and the semiconductor layer 100 may be patterned to form penetration holes, which expose portions of the lower insulating layer 50 on the first connection region CNR1. Thereafter, the insulating penetration patterns 111 may be formed to fill the penetration holes, and the buried insulating pattern 110 may be formed on the second connection region CNR2 to cover side surfaces of the semiconductor layer 100, the first insulating layer 101, the second insulating layer 103, the third insulating layer 105, and the conductive support layer SP. The insulating penetration pattern 111 and the buried insulating pattern 110 may be formed by filling the penetration holes with an insulating material and performing a planarization process to expose the top surface of the conductive support layer SP. During the formation of the insulating penetration pattern 111 and the buried insulating pattern 110, portions 113 of the insulating material may be left on the conductive support layer SP in the first and second openings OP1 and OP2.

Figure 12A:
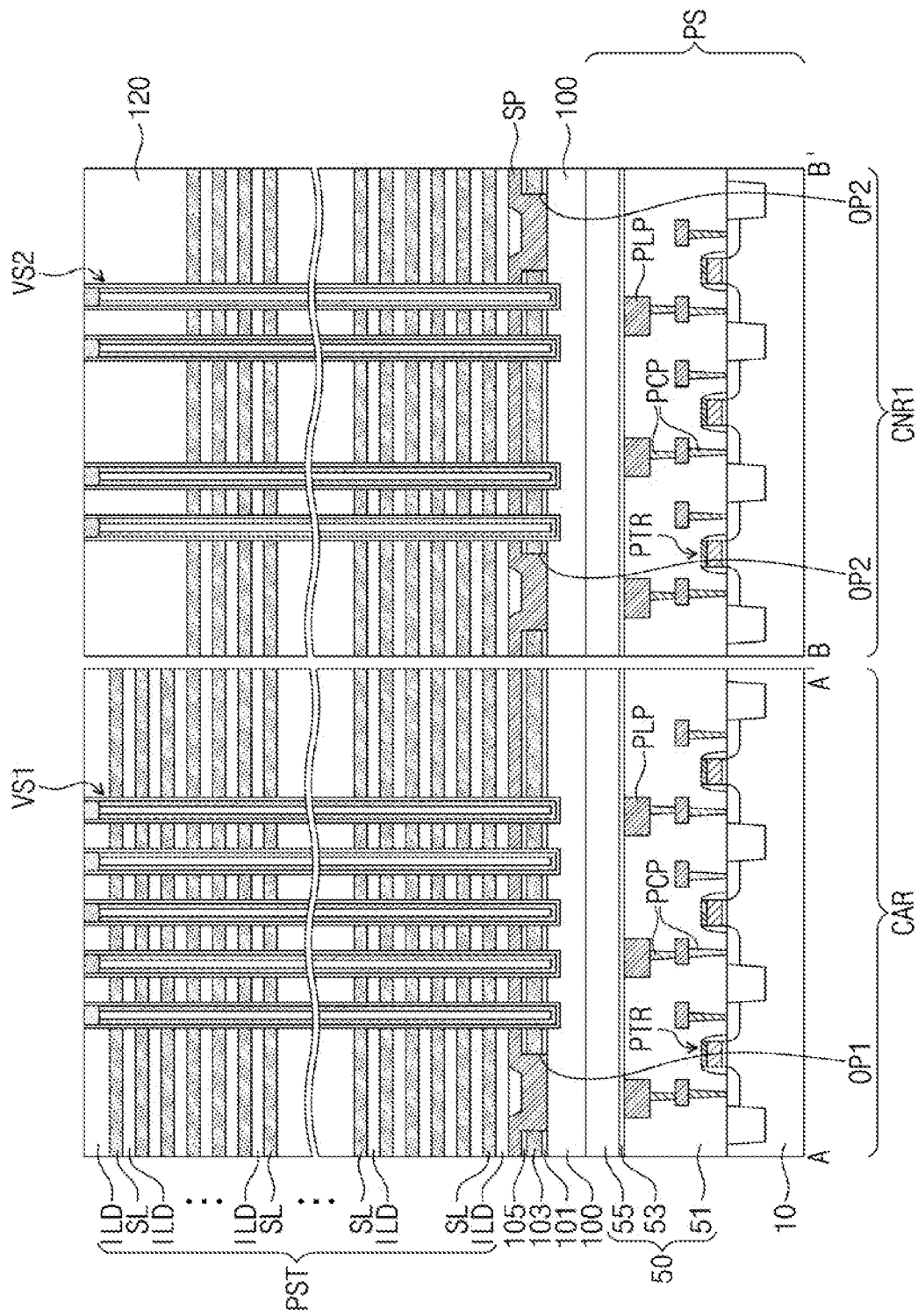
Figure 12B:
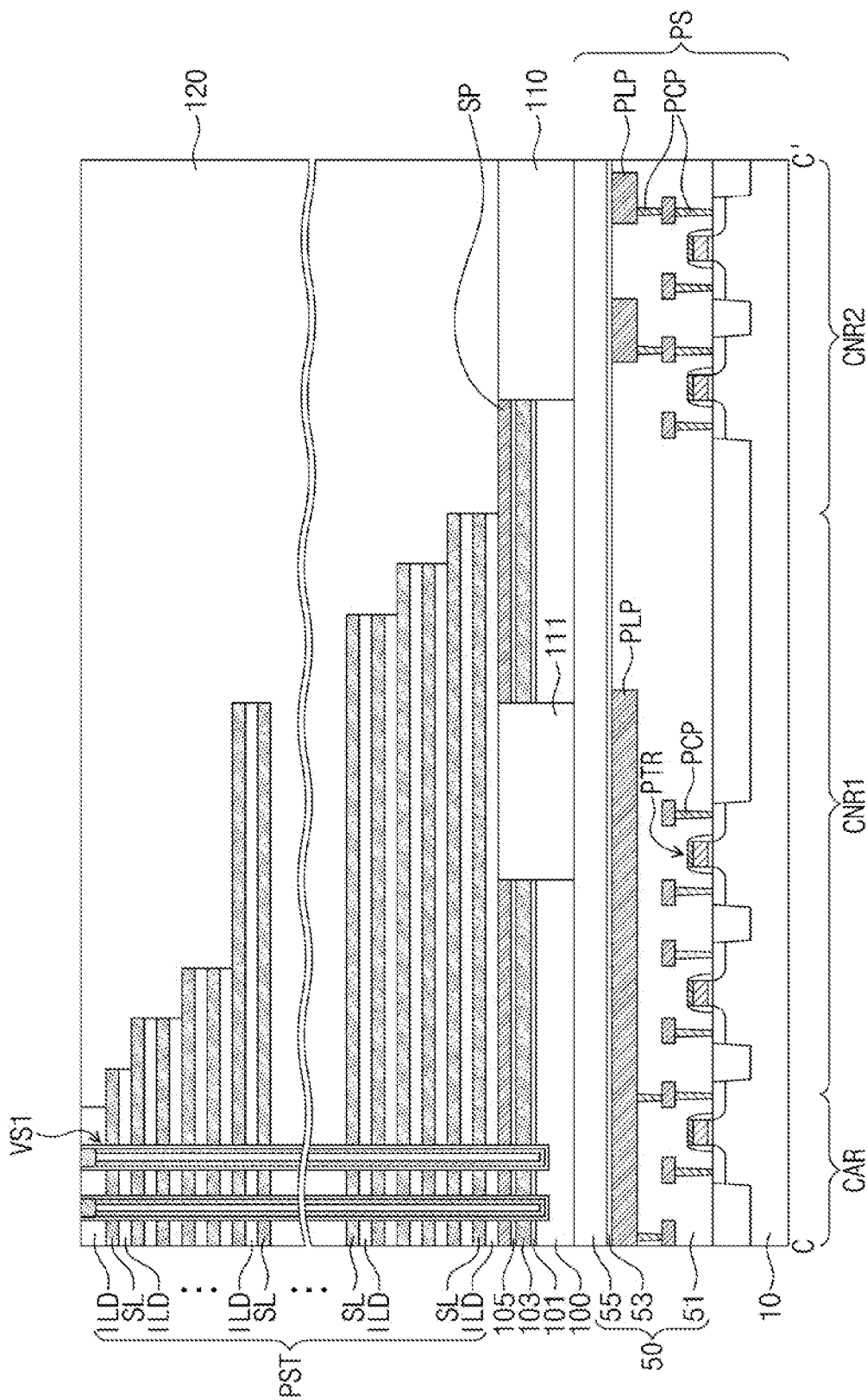

Referring to FIGS. 12A and 12B, a mold structure PST, in which the insulating layers ILD and sacrificial layers SL are vertically and alternately stacked, may be formed on the conductive support layer SP. The mold structure PST may have a stepwise structure, on the first connection region CNR1.

In the mold structure PST, the sacrificial layers SL may be formed of a material that can be etched with a high etch selectivity with respect to the insulating layers ILD. In an implementation, the sacrificial layers SL may be formed of an insulating material different from the insulating layers ILD. The sacrificial layers SL may be formed of the same material as the second insulating layer 103. In an implementation, the sacrificial layers SL may be formed of silicon nitride, and the insulating layers ILD may be formed of silicon oxide.

After the formation of the mold structure PST, the planarization insulating layer 120 may be formed on the buried insulating pattern 110 to cover the stepwise structure of the mold structure PST.

Thereafter, the first vertical structures VS1 may be formed to penetrate the mold structure PST on the cell array region CAR, and the second vertical structures VS2 may be formed to penetrate the mold structure PST on the first connection region CNR1.

The formation of the first and second vertical structures VS1 and VS2 may include forming first and second vertical holes to penetrate the mold structure PST, the conductive support layer SP, and the first to third insulating layers 101, 103, and 105 and then sequentially depositing a data storage layer and the vertical semiconductor layer in each of the first and second vertical holes. When the first and second vertical structures VS1 and VS2 are formed, the first and second vertical holes may have bottom surfaces that are at a level lower than the top surface of the semiconductor layer 100, and the data storage layer may be deposited using a chemical vapor deposition (CVD) or atomic layer deposition (ALD) method to cover bottom and inner side surfaces of the first and second vertical holes with a uniform thickness. The data storage layer may include a tunneling insulating layer, a charge storing layer, and a blocking insulating layer, which are sequentially stacked. The vertical semiconductor layer may be formed using a chemical vapor deposition (CVD) or atomic layer deposition (ALD) method to have a uniform thickness on the data storage layer. After the formation of the data storage layer and the vertical semiconductor layer, the first and second vertical holes may be filled with a gap-fill insulating layer. Thereafter, a planarization process may be performed on the gap-fill insulating layer, the vertical semiconductor layer, and the data storage layer to expose the top surface of the uppermost insulating layer ILD of the mold structure PST. Accordingly, the first and second data storage patterns DSP1 and DSP2, the first and second vertical semiconductor patterns VP1 and VP2, and the first and second gap-fill insulating patterns VI1 and VI2 may be formed, as previously described with reference to FIGS. 7A, 7B, and 8.

Next, bit line conductive pads may be formed on the first and second vertical semiconductor patterns DSP1 and DSP2 (e.g., see FIGS. 7A and 8) or in the top portions thereof. The bit line conductive pads may be impurity regions doped with impurities or may be formed of a conductive material.

Figure 13A:
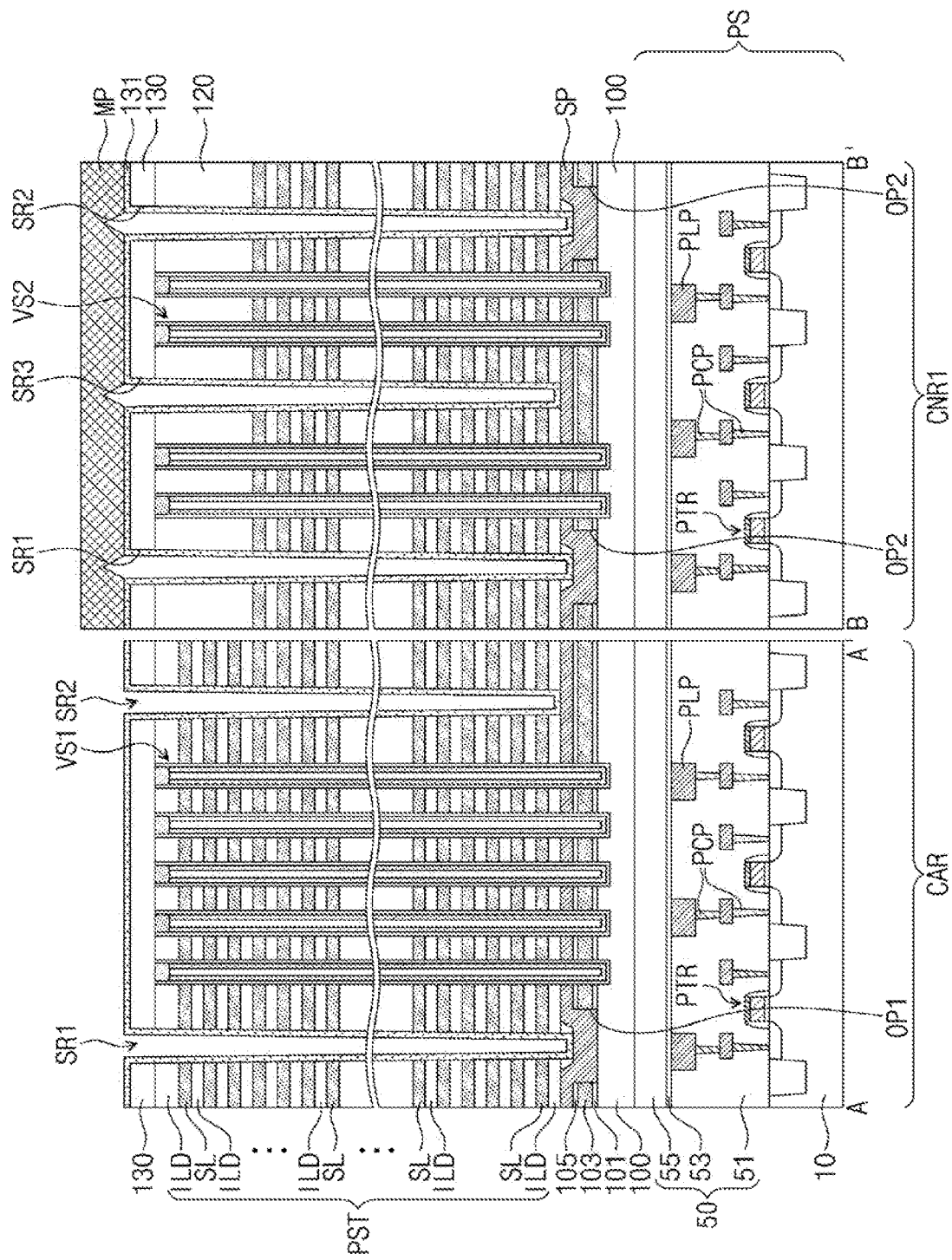
Figure 13B:
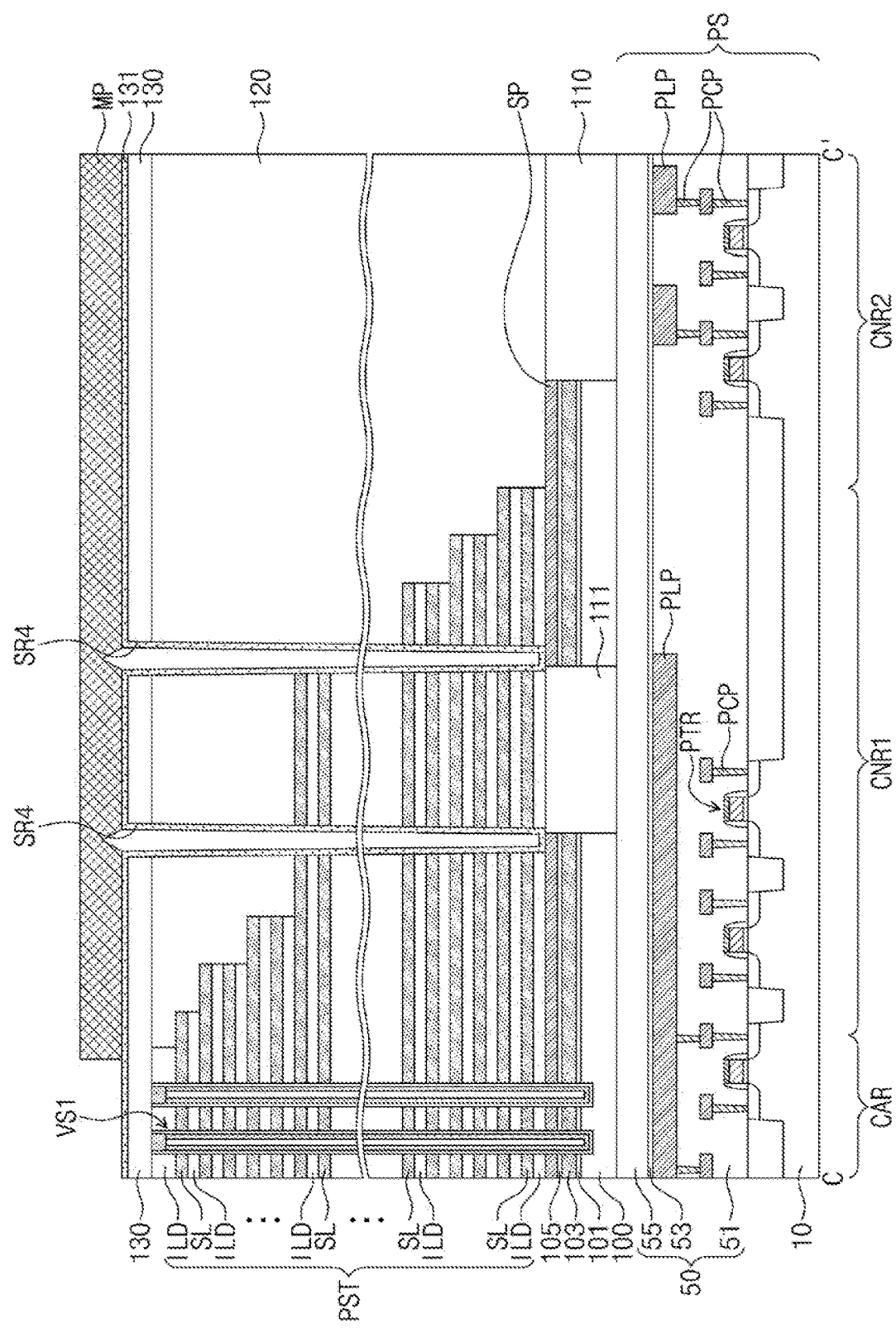

Referring to FIGS. 5, 13A, and 13B, after the formation of the first and second vertical structures VS1 and VS2, the first interlayer insulating layer 130 may be formed on the planarization insulating layer 120 to cover the top surfaces of the first and second vertical structures VS1 and VS2.

Next, first, second, third, and fourth separation trenches SR1, SR2, SR3, and SR4 may be formed to penetrate the mold structure PST and to expose the conductive support layer SP. The first, second, third, and fourth separation trenches SR1, SR2, SR3, and SR4 may be formed by anisotropically etching the planarization insulating layer 120 and the mold structure PST, and the conductive support layer SP may be used as an etch stop layer during the anisotropic etching process.

The first, second, and third separation trenches SR1, SR2, and SR3 may extend in the first direction D1. The first separation trenches SR1 may extend from the cell array region CAR onto the first connection region CNR1 in the first direction D1. The second separation trenches SR2 may extend from the cell array region CAR onto the first connection region CNR1 in the first direction D1 and may be shorter (e.g., in the first direction D1) than the first separation trenches SR1. The third separation trenches SR3 may extend from the first connection region CNR1 in the first direction D1.

The fourth separation trench SR4 may be formed to penetrate the mold structure PST on the first connection region CNR1 and may have a ring (e.g., closed loop) shape enclosing the insulating penetration pattern 111, when viewed in a plan view.

Next, a sacrificial spacer layer 131 may be formed to conformally cover inner surfaces of the first to fourth separation trenches SR1, SR2, SR3, and SR4.

The sacrificial spacer layer 131 may cover side and bottom surfaces of the separation trenches SR1, SR2, SR3, and SR4 with a uniform thickness. The sacrificial spacer layer 131 may be formed of or include a material (e.g., poly-silicon) having an etch selectivity with respect to the mold structure PST. The sacrificial spacer layer 131 may be deposited using a chemical vapor deposition (CVD) or atomic layer deposition (ALD) method to have a uniform thickness on the inner surfaces of the first to fourth separation trenches SR1, SR2, SR3, and SR4. The sacrificial spacer layer 131 may be formed to have a thickness that is smaller than about half of the minimum width of the first to fourth separation trenches SR1, SR2, SR3, and SR4. In an implementation, the sacrificial spacer layer 131 may define gap regions in the first to fourth separation trenches SR1, SR2, SR3, and SR4.

After the formation of the sacrificial spacer layer 131, a mask pattern MP may be formed to cover the sacrificial spacer layer 131 in the first and second connection regions CNR1 and CNR2. On the cell array region CAR, the mask pattern MP may expose the sacrificial spacer layer 131 in the first to fourth separation trenches SR1, SR2, SR3, and SR4.

The mask pattern MP may be formed on the sacrificial spacer layer 131, which is deposited on the top surface of the mold structure PST, using a deposition method having a poor step coverage property. In an implementation, on the first and second connection regions CNR1 and CNR2, the mask pattern MP may be formed to seal the top entrances of the first to fourth separation trenches SR1, SR2, SR3, and SR4 provided with the sacrificial spacer layer 131. Thus, empty spaces may be defined in the first to fourth separation trenches SR1, SR2, SR3, and SR4 with the sacrificial spacer layer 131, in the first connection region CNR1. The mask pattern MP may include, e.g., an amorphous carbon layer (ACL).

Figure 14A:
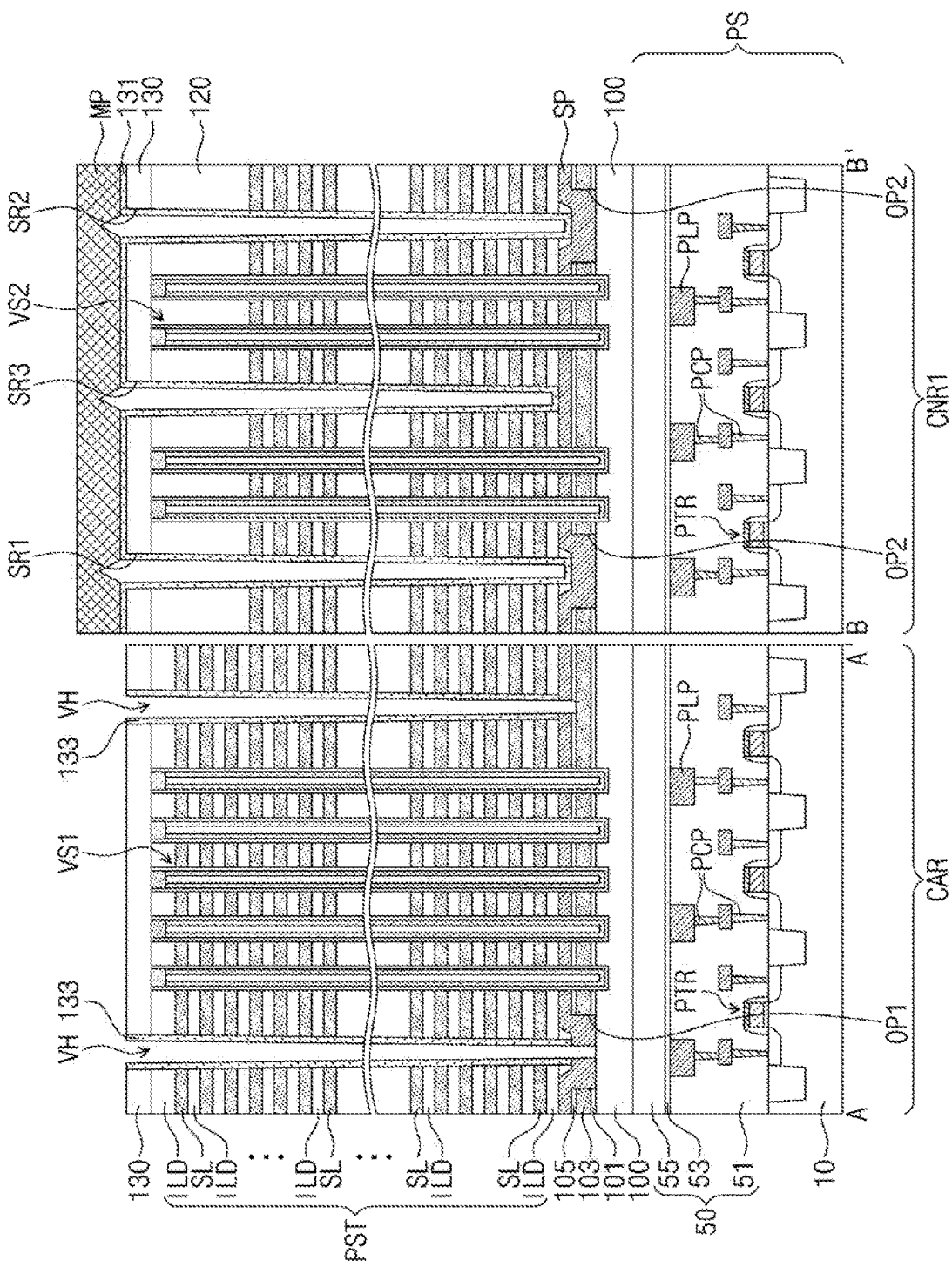
Figure 14B:
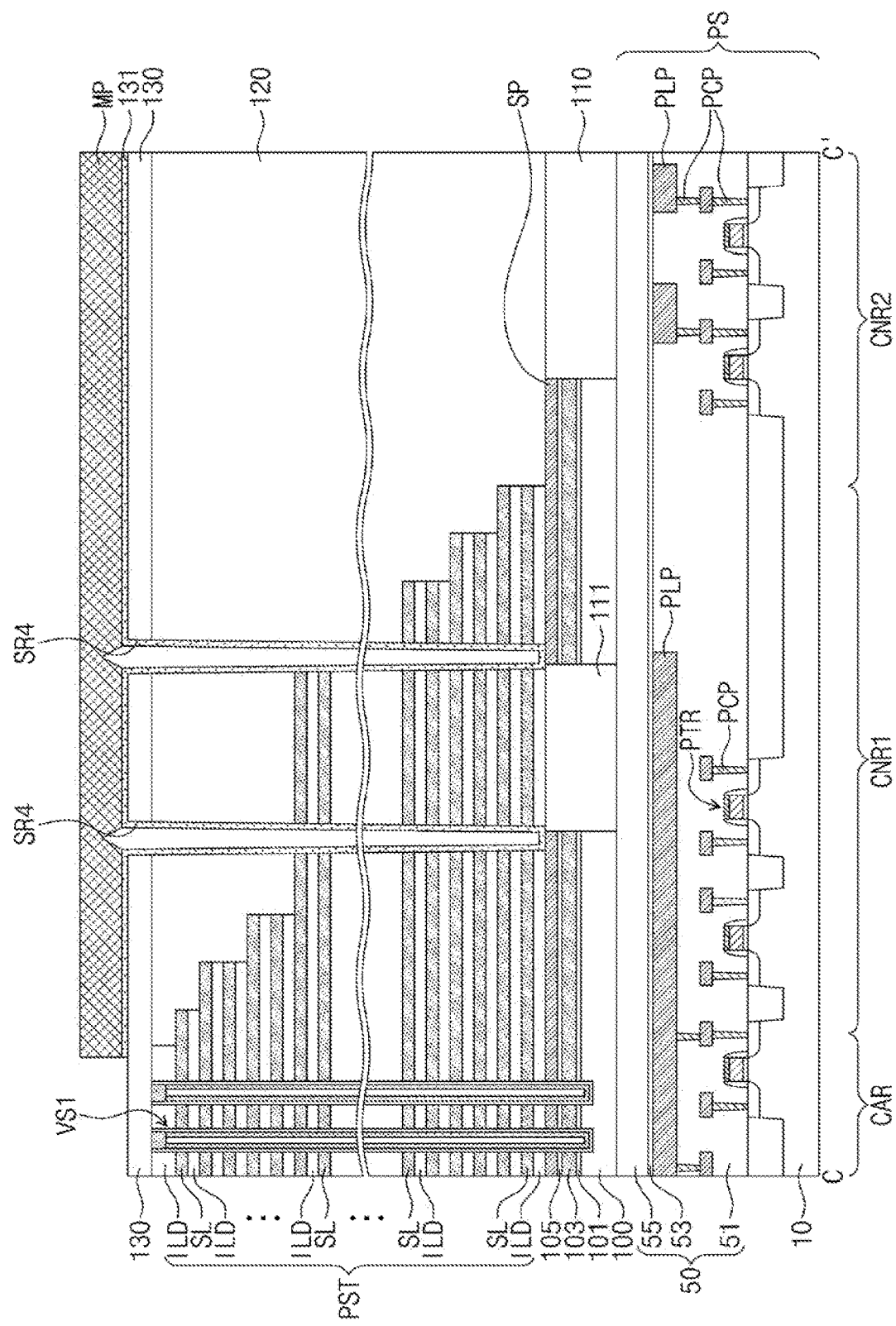

Referring to FIGS. 14A and 14B, an anisotropic etching process may be performed on the sacrificial spacer layer 131 exposed by the mask pattern MP. In an implementation, a sacrificial spacer 133 may be formed to cover the side surfaces of the first and second separation trenches SR1 and SR2 in the cell array region CAR.

During the anisotropic etching process to form the sacrificial spacer 133, penetration holes VH may be formed on the cell array region CAR to penetrate the support conductive pattern SP and the third insulating layer 105 below the first and second separation trenches SR1 and SR2 and to expose the second insulating layer 103. Some of the penetration holes VH may be formed to penetrate the support conductive pattern SP in the first openings OP1 and to expose the semiconductor layer 100.

The mask pattern MP may help prevent the sacrificial spacer layer 131 on the first connection region CNR1 from being etched, during the forming of the penetration hole VH on the cell array region CAR.

Figure 15A:
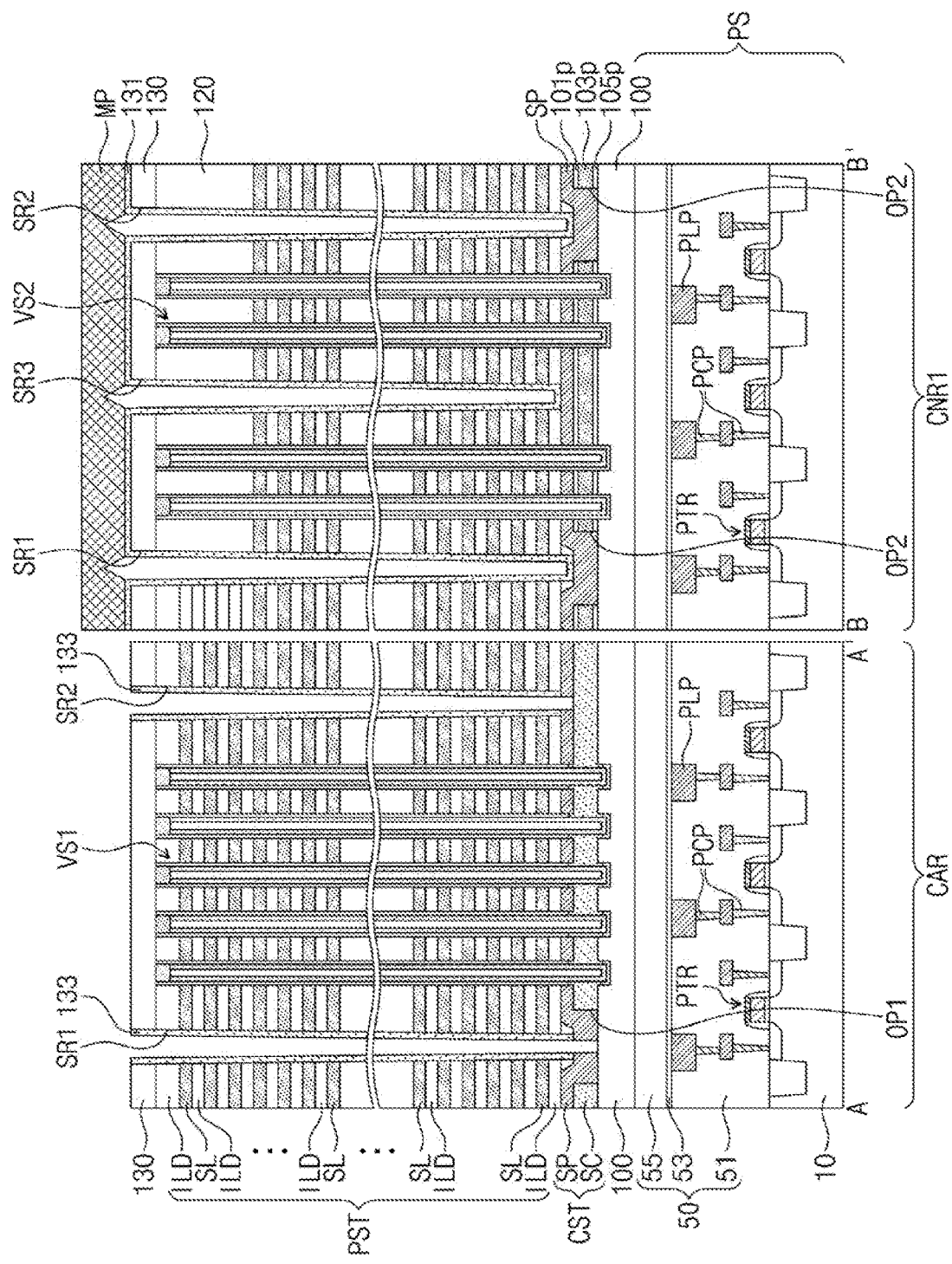
Figure 15B:
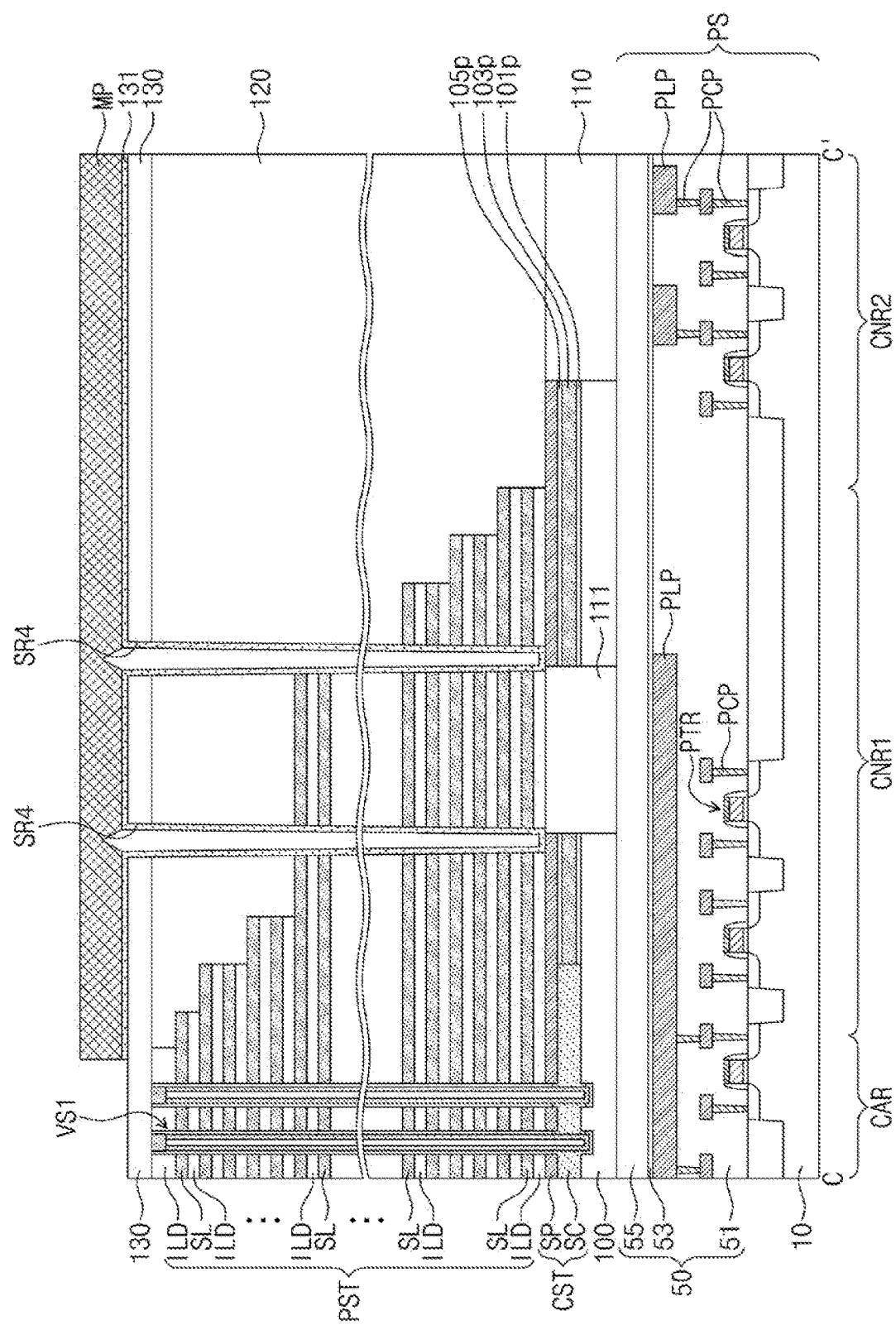

Referring to FIGS. 15A and 15B, a process may be performed to replace the first, second, and third insulating layers 101, 103, and 105 on the cell array region CAR with the source conductive pattern SC, after the formation of the penetration holes VH.

In an implementation, the process of forming the source conductive pattern SC may include performing an isotropic etching process on the first, second, and third insulating layers 101, 103, and 105 exposed through the penetration holes VH. During the isotropic etching process on the first, second, and third insulating layers 101, 103, and 105, portions of the support conductive pattern SP filling the first openings OP1 may be used as a supporter preventing the mold structure PST from collapsing.

The process of forming the source conductive pattern SC may include isotropically etching portions of the first data storage pattern DSP1 covering the side surface of the first vertical semiconductor pattern VP1 (see FIGS. 7A and 7B). Thus, the first vertical semiconductor patterns VP1 (e.g., of FIGS. 7A and 7B) may be partially exposed. As a result of the isotropic etching process on the first data storage pattern DSP1, the first data storage pattern DSP1 (e.g., of FIGS. 7A and 7B) and the dummy data storage pattern RDSP may be formed to be vertically spaced apart from each other.

A doped poly silicon layer may be deposited to form the source conductive pattern SC, after the partial exposure of the first vertical semiconductor patterns VP1 (e.g., of FIGS. 7A and 7B). Thus, the source structure CST may be formed between the semiconductor layer 100 and the mold structure PST.

In an implementation, when the source conductive pattern SC on formed in the cell array region CAR, portions of the first, second, and third insulating layers 101, 103, and 105 may be left or remain on the first connection region CNR1 to form the first, second, third dummy insulating patterns 101p, 103p, and 105p.

Figure 16A:
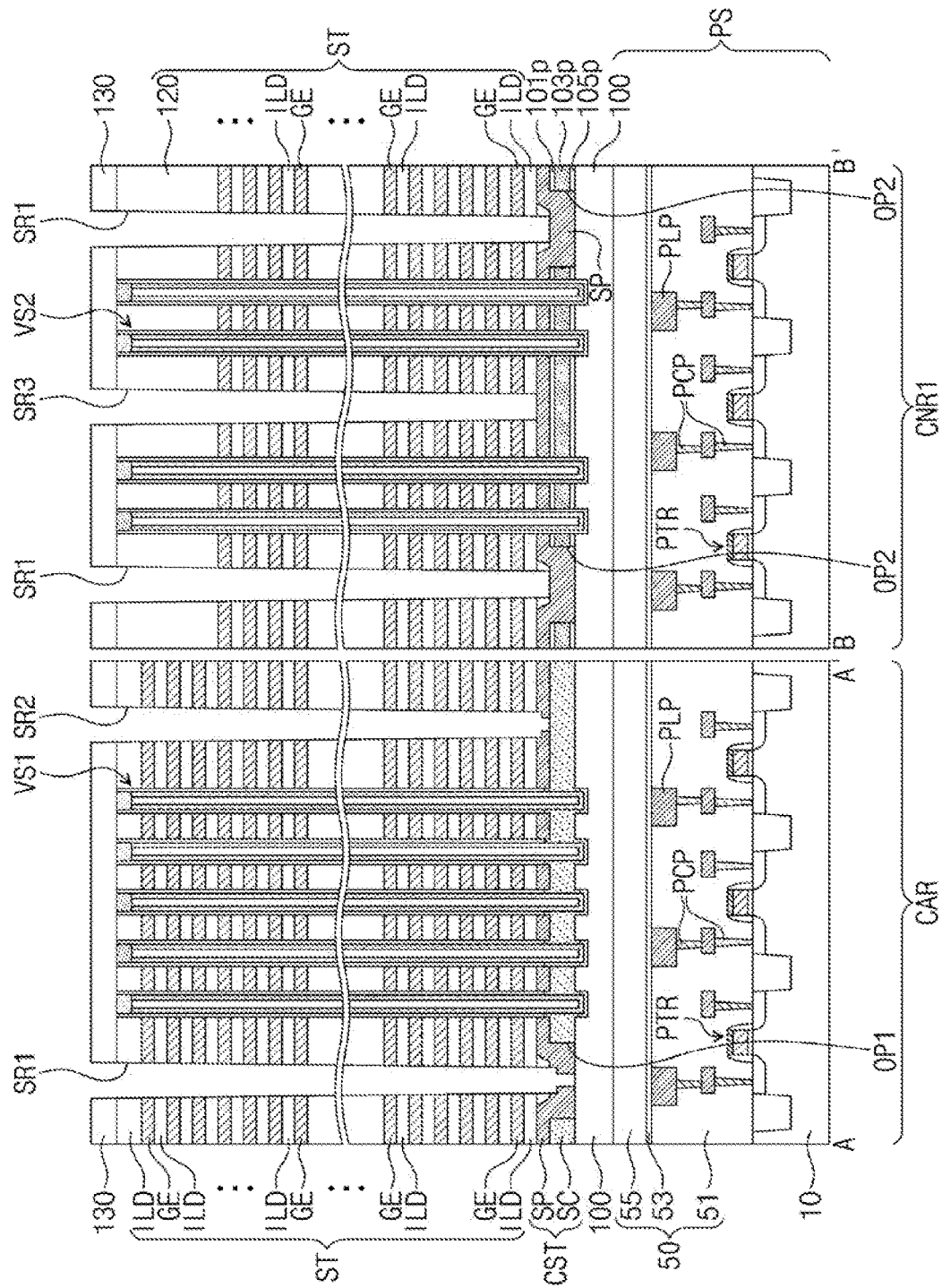
Figure 16B:
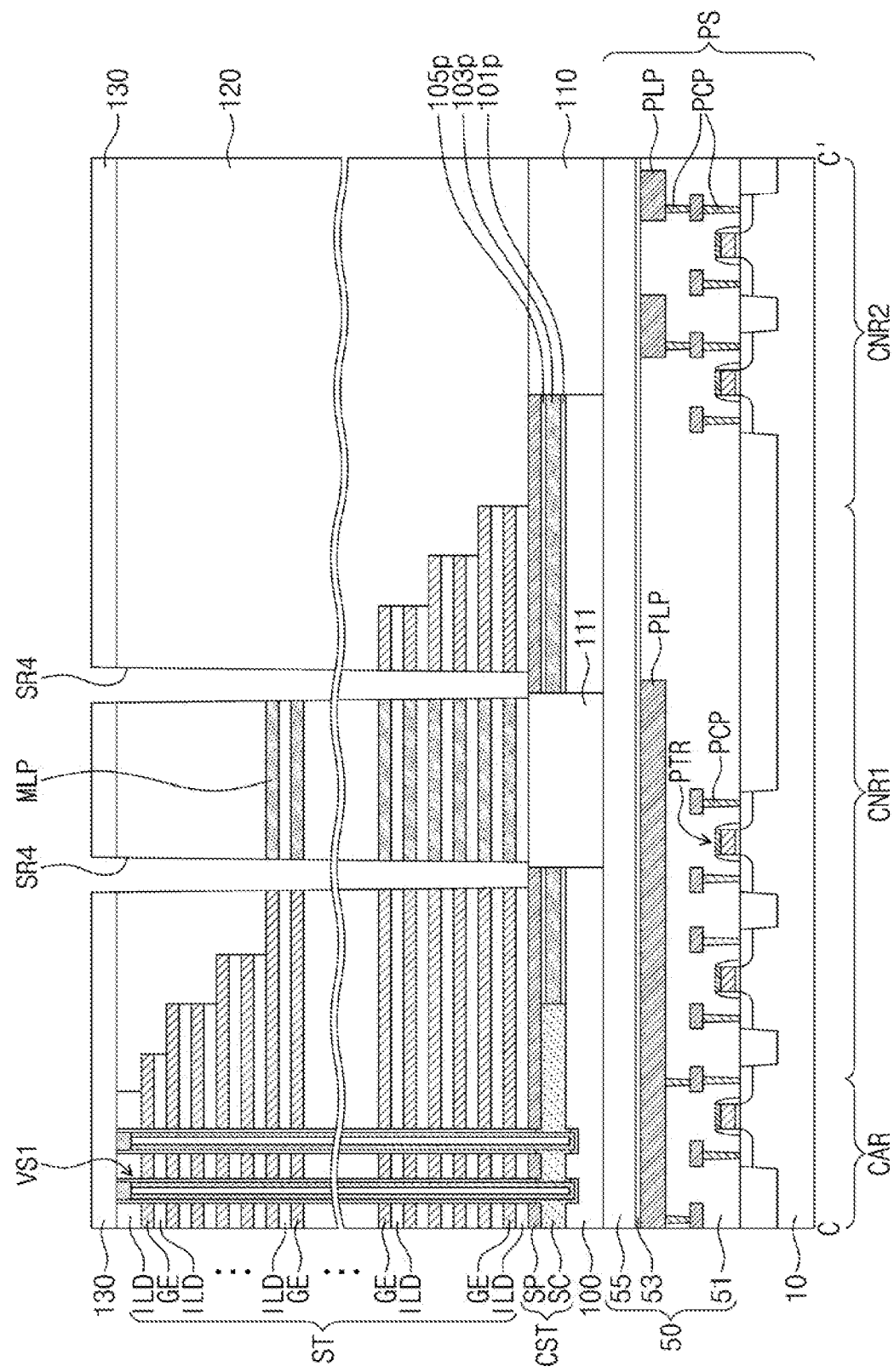

Referring to FIGS. 16A and 16B, the mask pattern may be removed by an ashing and strip process, after the formation of the source structure CST. Next, an isotropic etching process may be performed to remove the sacrificial spacer 133. The isotropic etching process on the sacrificial spacer 133 may be performed by a wet etching process, in which a DI water containing mixed solution (e.g., standard clean 1 (SC1)) or ammonium hydroxide (NH$_4$OH) is used. Accordingly, the side surfaces of the sacrificial layers SL of the mold structure PST may be re-opened by the first to fourth separation trenches SR1, SR2, SR3, and SR4. On the first connection region CNR1, the first to fourth separation trenches SR1, SR2, SR3, and SR4 may expose the top surface of the conductive support pattern SP.

Next, a process may be performed to replace the sacrificial layers SL with the electrodes GE, and as a result, the stack ST may be formed to have the afore-described structure. The formation of the stack ST may include isotropically etching the sacrificial layers SL using an etchant chosen to have an etch selectivity with respect to the insulating layers ILD, the first and second vertical structures VS1 and VS2, and the source structure CST. During the isotropic etching process on the sacrificial layers SL, portions of the sacrificial layers SL may be left on the first connection region CNR1 to form the mold patterns MLP.

Figure 17A:
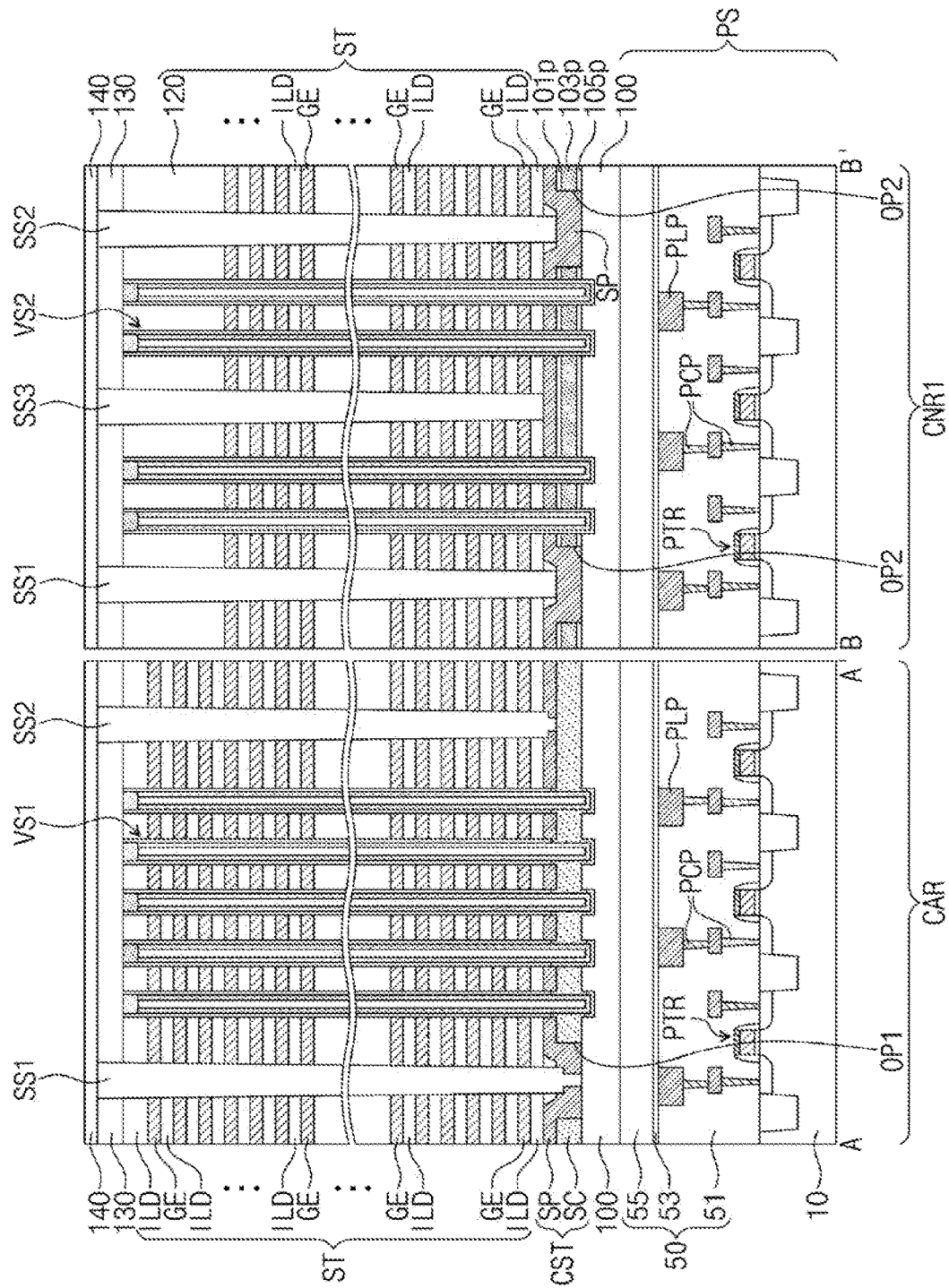
Figure 17B:
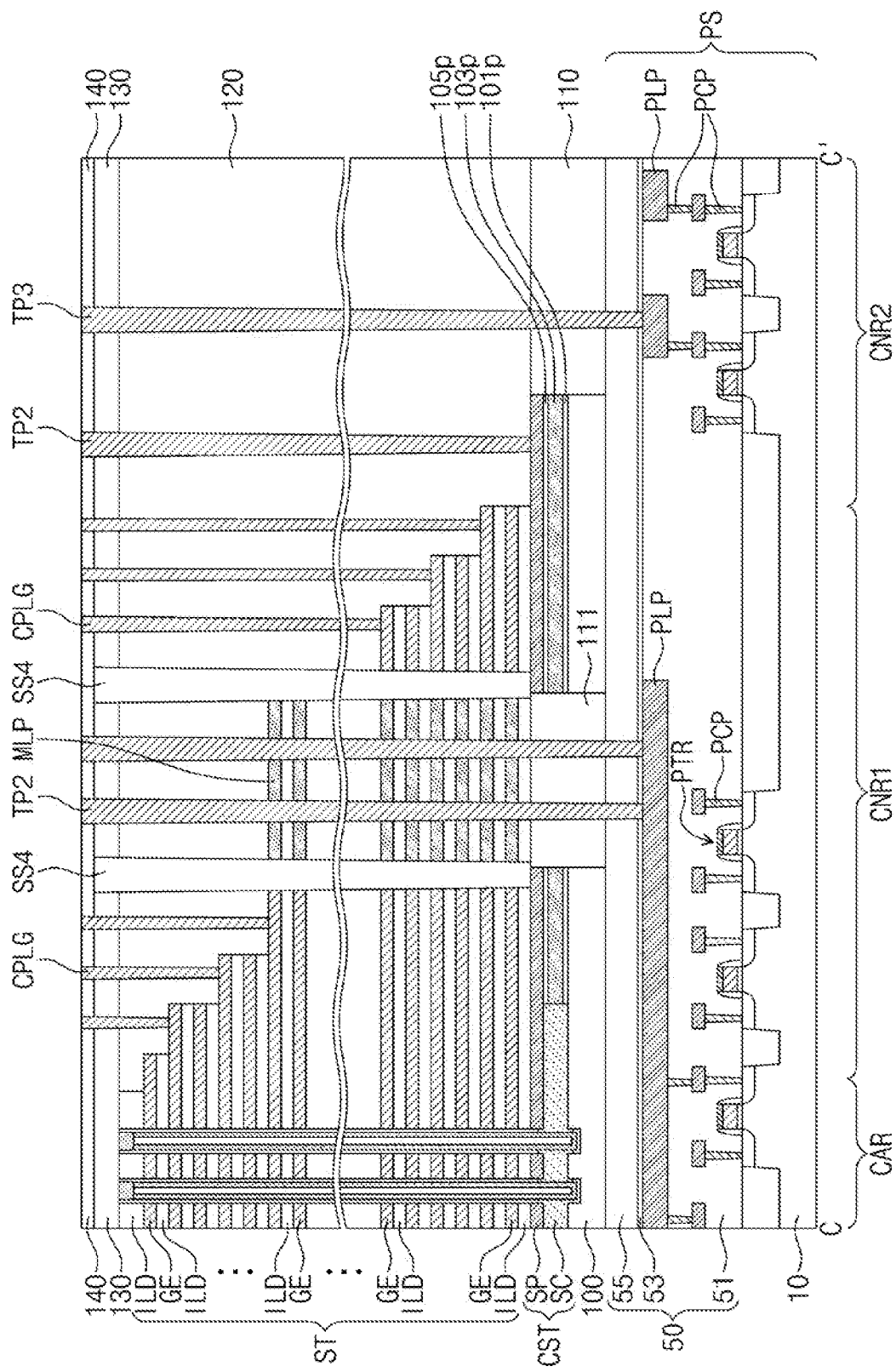

Referring to FIGS. 17A and 17B, the first, second, and third separation structures SS1, SS2, and SS3 and the insulating penetration pattern SS4 may be formed by filling the first to fourth separation trenches SR1, SR2, SR3, and SR4 with an insulating material, after the formation of the stack ST. The first, second, and third separation structures SS1, SS2, and SS3 and the insulating penetration pattern SS4 may have a multi- or single-layered structure. The first, second, and third separation structures SS1, SS2, and SS3 and the insulating penetration pattern SS4 may be formed of or include silicon oxide, silicon nitride, or poly silicon.

Thereafter, the second interlayer insulating layer 140 may be formed on the first interlayer insulating layer 130, and then, the cell contact plugs CPLG, which are respectively connected to the electrodes GE of the stack ST, may be formed. In addition, the first and third penetration plugs TP1 and TP3 may be formed to be connected to the peripheral circuit interconnection lines PLP, and the second penetration plug TP2 may be formed to be connected to the source structure CST.

Referring back to FIGS. 5, 6A, and 6B, the lower and upper contact plugs LCT and UCT and the connection conductive pattern ICT may be formed in the third and fourth interlayer insulating layers 150 and 160. The bit lines BL and the conductive lines CL may be formed on the fourth interlayer insulating layer 160.

Figure 18:
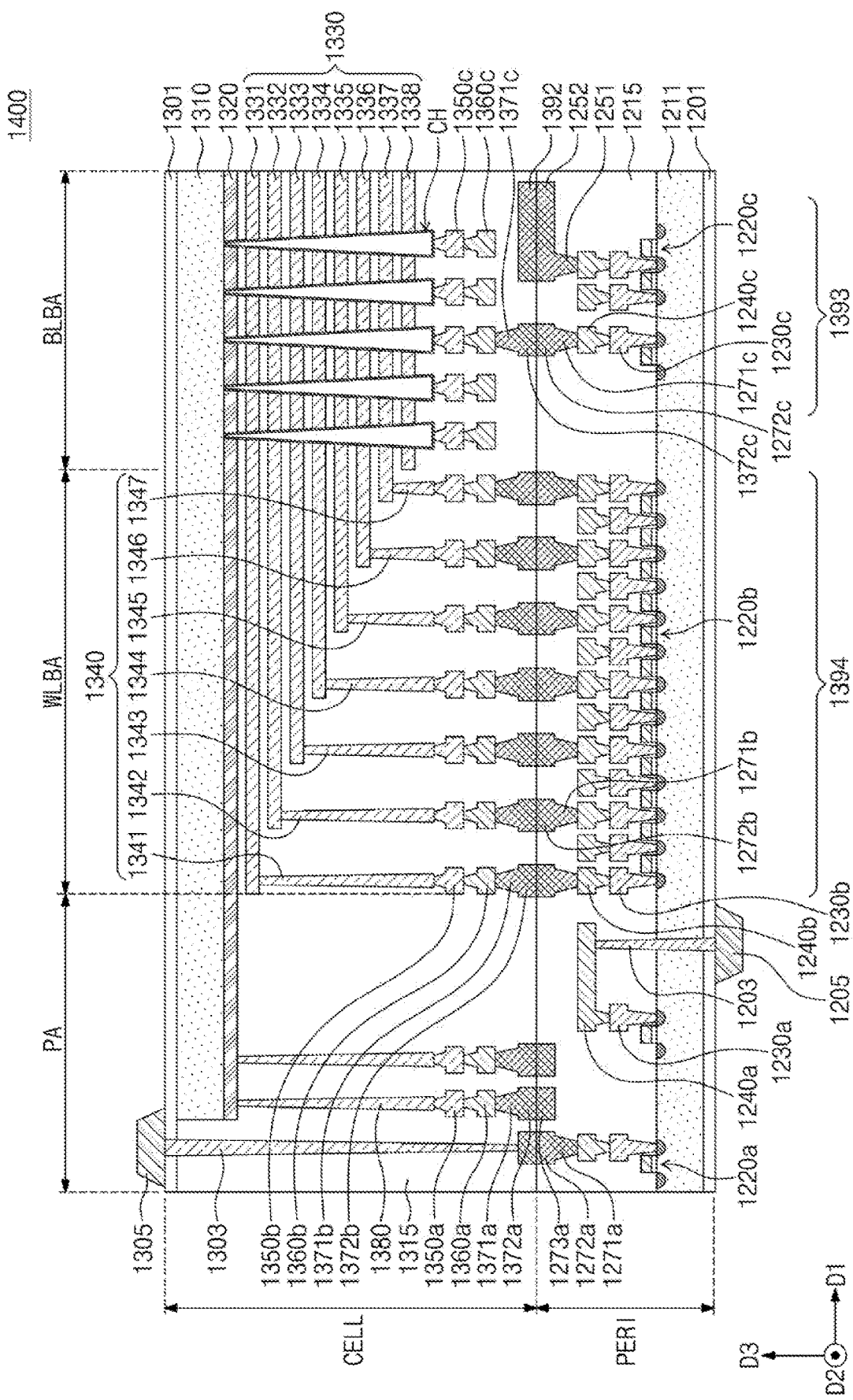
FIG. 18 is a sectional view of a semiconductor device according to an embodiment.

FIG. 18 is a sectional view of a semiconductor device according to an embodiment.

Referring to FIG. 18, a memory device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. In the bonding manner, a bonding metal, which is formed in the uppermost metal layer of the upper chip, may be electrically connected to a bonding metal, which is formed in the uppermost metal layer of the lower chip. In an implementation, in the case where the bonding metal is formed of copper (Cu), the bonding manner may be a Cu-to-Cu bonding manner. In an implementation, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1211, an interlayer insulating layer 1215, a plurality of circuit devices 1220a, 1220b, and 1220c, which are formed in the first substrate 1211, first metal layers 1230a, 1230b, and 1230c, which are respectively connected to the circuit devices 1220a, 1220b, and 1220c, and second metal layers 1240a, 1240b, and 1240c, which are formed on the first metal layers 1230a, 1230b, and 1230c. In an implementation, the first metal layers 1230a, 1230b, and 1230c may be formed of or include a material (e.g., tungsten) having relatively high electric resistivity, and the second metal layers 1240a, 1240b, and 1240c may be formed of or include a material (e.g., copper) having relatively low electric resistivity.

FIG. 18 illustrates only the first metal layers 1230a, 1230b, and 1230c and the second metal layers 1240a, 1240b, and 1240c. In an implementation, at least one metal layer may be further formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c.

The interlayer insulating layer 1215 may be on the first substrate 1211 to cover the circuit devices 1220a, 1220b, and 1220c, the first metal layers 1230a, 1230b, and 1230c, and the second metal layers 1240a, 1240b, and 1240c and may be formed of or include an insulating material (e.g., silicon oxide or silicon nitride).

Lower bonding metals 1271b and 1272b may be formed on the second metal layer 1240b on the word line bonding region WLBA. On the word line bonding region WLBA, the lower bonding metals 1271b and 1272b of the peripheral circuit structure PERI may be electrically connected to upper bonding metals 1371b and 1372b of the cell array structure CELL in a bonding manner. In an implementation, the lower bonding metals 1271b and 1272b and the upper bonding metals 1371b and 1372b may be formed of or include aluminum, copper, or tungsten.

The cell array structure CELL may include at least one memory block. The cell array structure CELL may include a second substrate 1310 and a common source line 1320. A plurality of word lines 1331-1338 (1330) may be stacked on the second substrate 1310 in a direction (e.g., a z-axis direction or third direction D3) that is perpendicular to a top surface of the second substrate 1310. String selection lines and a ground selection line may be respectively on and below the word lines 1330, and the word lines 1330 may be between the string selection lines and the ground selection line.

On the bit line bonding region BLBA, a channel structure CH may extend in the direction (e.g., the z-axis or third direction D3) perpendicular to a top surface of the second substrate 1310 and to penetrate the word lines 1330, the string selection lines, and the ground selection line. The channel structure CH may include a data storage layer, a channel layer, and a buried insulating layer, and in this case, a first metal layer 1350c and a second metal layer 1360c may be electrically connected to the channel layer. In an implementation, the first metal layer 1350c may include the bit line contact plugs, and the second metal layer 1360c may include the bit lines. In an implementation, the bit line 1360c may be extended in the first direction D1 (e.g., a y-axis direction) parallel to the top surface of the second substrate 1310.

In an implementation, as shown in FIG. 18, a region, in which the channel structure CH and the bit lines 1360c are provided, may be defined as the bit line bonding region BLBA. On the bit line bonding region BLBA, the bit lines 1360c may be electrically connected to the circuit devices 1220c, which constitute a page buffer 1393 of the peripheral circuit structure PERI. In an implementation, the bit lines 1360c may be connected to upper bonding metals 1371c and 1372c of the peripheral circuit structure PERI, and the upper bonding metals 1371c and 1372c may be connected to lower bonding metals 1271c and 1272c, which are connected to the circuit devices 1220c of the page buffer 1393.

On the word line bonding region WLBA, the word lines 1330 may extend in the first direction D1 (e.g., an x-axis direction), which is perpendicular to the second direction D2 and is parallel to the top surface of the second substrate 1310, and may be connected to a plurality of cell contact plugs 1341-1347 (1340). The cell contact plugs 1340 may be connected to pads of the word lines 1330, which are extended in the third direction D3. A first metal layer 1350b and a second metal layer 1360b may be sequentially connected to upper portions of the cell contact plugs 1340 connected to the word lines 1330. On the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

On the peripheral circuit structure PERI, the cell contact plugs 1340 may be electrically connected to the circuit devices 1220b constituting a row decoder 1394. In an implementation, an operation voltage of the circuit devices 1220b constituting the row decoder 1394 may be different from an operation voltage of the circuit devices 1220c constituting the page buffer 1393. In an implementation, the operation voltage of the circuit devices 1220c constituting the page buffer 1393 may be higher than the operation voltage of the circuit devices 1220b constituting the row decoder 1394.

A common source line contact plug 1380 may be on the outer pad bonding region PA. The common source line contact plug 1380 may be formed of or include a conductive material (e.g., metals, metal compounds, or polysilicon) and may be electrically connected to the common source line 1320. A first metal layer 1350a and a second metal layer 1360a may be sequentially stacked on the common source line contact plug 1380. The outer pad bonding region PA may be or include a region, in which the common source line contact plug 1380, the first metal layer 1350a, and the second metal layer 1360a are provided.

In an implementation, input/output pads 1205 and 1305 may be on the outer pad bonding region PA. Referring to FIG. 18, a lower insulating layer 1201 may be below the first substrate 1211 to cover the bottom surface of the first substrate 1211, and the first input/output pad 1205 may be on the lower insulating layer 1201. The first input/output pad 1205 may be connected to at least one of the circuit devices 1220a, 220b, and 220c of the peripheral circuit structure PERI through a first input/output contact plug 1203 and may be separated apart from the first substrate 1211 by the lower insulating layer 1201. In an implementation, a sidewall insulating layer may be between the first input/output contact plug 1203 and the first substrate 1211 to electrically separate the first input/output contact plug 1203 from the first substrate 1211.

Referring to FIG. 18, an upper insulating layer 1301 may be on the second substrate 1310 to cover the top surface of the second substrate 1310, and the second input/output pad 1305 may be on the upper insulating layer 1301. The second input/output pad 1305 may be connected to at least one of the circuit devices 1220a, 1220b, and 1220c of the peripheral circuit structure PERI through a second input/output contact plug 1303. In an implementation, the second input/output pad 1305 may be electrically connected to the circuit device 1220a.

In an implementation, the second substrate 1310 and the common source line 1320 may be spaced apart from a region, in which the second input/output contact plug 1303 is provided. In an implementation, the second input/output pad 1305 may not overlap with the word lines 1330 in the third direction (e.g., the z-axis direction). Referring to FIG. 18, the second input/output contact plug 1303 may be spaced apart from the second substrate 1310 in a direction, which is parallel to the top surface of the second substrate 1310, to penetrate an interlayer insulating layer 1315 of the cell array structure CELL and may be connected to the second input/output pad 1305.

In an implementation, the first input/output pad 1205 and the second input/output pad 1305 may be optionally included. In an implementation, the memory device 1400 may include only the first input/output pad 1205, on the first substrate 1211, or include only the second input/output pad 1305, on the second substrate 1310. In an implementation, the memory device 1400 may include both of the first and second input/output pads 1205 and 1305.

A metal pattern, which is used as a dummy pattern, may be in the uppermost metal layer of the outer pad bonding region PA and the bit line bonding region BLBA, which are included in each of the cell array structure CELL and the peripheral circuit structure PERI, or may not be provided in the uppermost metal layer.

The memory device 1400 may include an upper metal pattern 1372a and a lower metal pattern 1273a, which are in the outer pad bonding region PA. In an implementation, the lower metal pattern 1273a may be in the uppermost metal layer of the peripheral circuit structure PERI to correspond to the upper metal pattern 1372a, which is in the uppermost metal layer of the cell array structure CELL, or to have the same shape as the upper metal pattern 1372a of the cell array structure CELL. The lower metal pattern 1273a, which is in the uppermost metal layer of the peripheral circuit structure PERI, may not be connected to any contact plug in the peripheral circuit structure PERI. In an implementation, the upper metal pattern 1372a may be in the uppermost metal layer of the cell array structure CELL and in the outer pad bonding region PA to correspond to the lower metal pattern 1273a, which is in the uppermost metal layer of the peripheral circuit structure PERI, or may have the same shape as the lower metal pattern 1273a of the peripheral circuit structure PERI.

The lower bonding metals 1271b and 1272b may be on the second metal layer 1240b on the word line bonding region WLBA. On the word line bonding region WLBA, the lower bonding metals 1271b and 1272b of the peripheral circuit structure PERI may be electrically connected to the upper bonding metals 1371b and 1372b of the cell array structure CELL by a Cu-to-Cu bonding.

In an implementation, on the bit line bonding region BLBA, an upper metal pattern 1392 corresponding to a lower metal pattern 1252 in the uppermost metal layer of the peripheral circuit region PERI, and having the same cross-sectional shape as the lower metal pattern 1252 of the peripheral circuit region PERI, may be in the uppermost metal layer of the cell array structure CELL. In an implementation, any contact plug may not be formed on the upper metal pattern 1392, which is in the uppermost metal layer of the cell array structure CELL.

In an implementation, corresponding to a metal pattern formed in an uppermost metal layer in one of the cell region CELL and the peripheral circuit region PERI, a reinforcement metal pattern having the same cross-sectional shape as the metal pattern may be in an uppermost metal layer in the other one of the cell region CELL and the peripheral circuit region PERI. In an implementation, contact may not be formed on the reinforcement metal pattern.

By way of summation and review, increasing the data storage capacity of a semiconductor device has been considered. For example, semiconductor devices, in which memory cells are three-dimensionally arranged, may be considered.

According to an embodiment, when penetration holes are formed to expose a lower sacrificial layer in a cell array region, a mold structure in a connection region may be covered with a mask pattern. Thus, it may be possible to prevent sacrificial layers of the mold structure in the connection region from being lost while a source structure is formed in the cell array region.

One or more embodiments may provide a semiconductor device with improved reliability and an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a cell array region and a connection region;
   a stack including electrodes vertically stacked on the substrate;
   a source conductive pattern on the cell array region and between the substrate and the stack;
   a dummy insulating pattern on the connection region and between the substrate and the stack;
   a conductive support pattern between the stack and the source conductive pattern and between the stack and the dummy insulating pattern;
   a plurality of first vertical structures on the cell array region and penetrating the stack, the conductive support pattern, and the source conductive pattern
   a first separation structure penetrating the stack and extending in a first direction,
   wherein the first separation structure includes a first portion on the cell array region and a second portion on the connection region, and
   wherein the second portion of the first separation structure is in contact with a top surface of the conductive support pattern and is vertically spaced apart from the dummy insulating pattern.

2. The semiconductor device as claimed in claim 1, wherein the dummy insulating pattern includes a first insulating pattern and a second insulating pattern, the first insulating pattern and the second insulating pattern being sequentially stacked and including different insulating materials from each other.

3. The semiconductor device as claimed in claim 1, further comprising:
   a second separation structure on the cell array region, extending in the first direction, and penetrating the stack and the conductive support pattern.

4. The semiconductor device as claimed in claim 3, wherein the second separation structure includes a bottom portion having a first width at its bottom surface and a middle portion having a second width, the second width being greater than the first width.

5. The semiconductor device as claimed in claim 1, wherein the conductive support pattern includes:
   a first portion on the cell array region, penetrating a portion of the source conductive pattern, and contacting the substrate; and
   a second portion on the connection region, penetrating a portion of the dummy insulating pattern, and contacting the substrate.

6. The semiconductor device as claimed in claim 5, wherein the second portion of the conductive support pattern has a substantially uniform thickness.

7. The semiconductor device as claimed in claim 1, further comprising:
a second separation structure on the cell array region, extending in the first direction, and penetrating the stack, the conductive support pattern, and the source conductive pattern
wherein a portion of the conductive support pattern is between the second portion of the first separation structure and the substrate.

8. The semiconductor device as claimed in claim 1, further comprising a plurality of second vertical structures on the connection region and penetrating the stack, the conductive support pattern, and the dummy insulating pattern, wherein:
each of the first vertical structures includes a first vertical semiconductor pattern whose side surface is partially in contact with the source conductive pattern; and
each of the second vertical structures includes a second vertical semiconductor pattern spaced apart from the dummy insulating pattern.

9. The semiconductor device as claimed in claim 8, wherein:
each of the first vertical structures further includes a first data storage pattern on the source conductive pattern and enclosing a part of the side surface of the first vertical semiconductor pattern, and
each of the second vertical structures further includes a second data storage pattern conformally covering side and bottom surfaces of the second vertical semiconductor pattern.

10. The semiconductor device as claimed in claim 9, wherein a portion of the second data storage pattern is between the dummy insulating pattern and the second vertical semiconductor pattern.

11. The semiconductor device as claimed in claim 8, wherein the source conductive pattern includes:
a horizontal portion below the stack and extending parallel to the stack; and
a sidewall portion extending from the horizontal portion, having a vertically protruding shape, and enclosing a portion of the side surface of the first vertical semiconductor pattern.

12. The semiconductor device as claimed in claim 1, further comprising a plurality of second vertical structures on the connection region and penetrating the stack, the conductive support pattern, and the dummy insulating pattern, wherein:
each of the electrodes includes a pad portion on the connection region,
the pad portions of the electrodes are stacked to form a stepwise structure, and
the second vertical structures penetrate the pad portions of the electrodes.

13. The semiconductor device as claimed in claim 1, further comprising a penetration interconnection structure on the connection region and penetrating a portion of the stack,
wherein the penetration interconnection structure includes:
mold patterns on the connection region and at same levels as the electrodes;
an insulating penetration pattern between the electrodes and the mold patterns; and
conductive penetration plugs penetrating the mold patterns.

14. The semiconductor device as claimed in claim 13, wherein the insulating penetration pattern is in contact with a top surface of the conductive support pattern.

15. The semiconductor device as claimed in claim 13, wherein the insulating penetration pattern encloses the mold patterns, when viewed in a plan view.

16. A semiconductor device, comprising:
a semiconductor substrate;
a peripheral circuit structure including peripheral circuits integrated on the semiconductor substrate;
a semiconductor layer on the peripheral circuit structure, the semiconductor layer including a cell array region and a connection region;
a stack including electrodes vertically stacked on the semiconductor layer to form a stepwise structure on the connection region;
a planarization insulating layer covering the stack;
a source conductive pattern on the cell array region and between the substrate and the stack;
a dummy insulating pattern on the connection region and between the substrate and the stack;
a conductive support pattern between the stack and the source conductive pattern and between the stack and the dummy insulating pattern;
a plurality of first vertical structures on the cell array region and penetrating the stack, the conductive support pattern, and the source conductive pattern, each of the first vertical structures including a first vertical semiconductor pattern, whose side surface is partially in contact with the source conductive pattern, and a first data storage pattern on the source conductive pattern and enclosing a part of the side surface of the first vertical semiconductor pattern;
a first separation structure on the cell array region, extending in a first direction, and penetrating the stack, the conductive support pattern, and the source conductive pattern; and
a second separation structure on the connection region, in contact with a top surface of the conductive support pattern, extending in the first direction, and penetrating the stack.

17. The semiconductor device as claimed in claim 16, wherein:
the dummy insulating pattern includes a first insulating pattern, a second insulating pattern, and a third insulating pattern, which are sequentially stacked, and
the second insulating pattern includes an insulating material different from the first insulating pattern and the third insulating pattern.

18. The semiconductor device as claimed in claim 16, wherein a portion of the conductive support pattern is between the second separation structure and the substrate.

19. The semiconductor device as claimed in claim 16, further comprising a penetration interconnection structure on the connection region and penetrating a portion of the stack,
wherein the penetration interconnection structure includes:
mold patterns on the connection region and at same levels as the electrodes;
an insulating penetration pattern between the electrodes and the mold patterns; and
conductive penetration plugs penetrating the mold patterns.

20. An electronic system, comprising:
a semiconductor device including a substrate including a cell array region and a connection region, a stack including electrodes vertically stacked on the substrate, a source conductive pattern on the cell array region and between the substrate and the stack, a dummy insulating pattern on the connection region and between the substrate and the stack, a conductive support pattern between the stack and the source conductive pattern and between the stack and the dummy insulating pattern, a plurality of first vertical structures on the cell array region and penetrating the stack, the conductive support pattern, and the source conductive pattern, a separation structure penetrating the stack and contacting the conductive support pattern on the connection region, the separation structure vertically spaced apart from the dummy insulating pattern and an input/output pad electrically connected to peripheral circuits; and
a controller electrically connected to the semiconductor device through the input/output pad and being configured to control the semiconductor device.

* * * * *